US012727423B2

(12) United States Patent
Nemoto

(10) Patent No.: US 12,727,423 B2
(45) Date of Patent: Sep. 1, 2026

(54) SUBSTRATE PROCESSING APPARATUS

(71) Applicant: SCREEN Holdings Co., Ltd., Kyoto (JP)

(72) Inventor: Shuhei Nemoto, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 511 days.

(21) Appl. No.: 18/366,068

(22) Filed: Aug. 7, 2023

(65) Prior Publication Data

US 2024/0066548 A1 Feb. 29, 2024

(30) Foreign Application Priority Data

Aug. 26, 2022 (JP) ................................ 2022-134815

(51) Int. Cl.
*H10P 72/00* (2026.01)
*B05C 11/08* (2006.01)
(Continued)

(52) U.S. Cl.
CPC .......... *H10P 72/0414* (2026.01); *B05C 11/08* (2013.01); *B05C 11/10* (2013.01); (Continued)

(58) Field of Classification Search
CPC .. B05C 11/08; H10P 72/0414; H10P 72/0402; H10P 72/0462; H10P 72/7624; H10P 72/7612
See application file for complete search history.

(56) References Cited

U.S. PATENT DOCUMENTS 5,591,264 A * 1/1997 Sugimoto ............... B05C 11/08 118/52
2003/0172955 A1 9/2003 Kuroda et al.
(Continued)

FOREIGN PATENT DOCUMENTS

CN 107851572 A 3/2018
JP H11-111665 A 4/1999
(Continued)

OTHER PUBLICATIONS

Office Action issued May 24, 2025 for the corresponding Chinese Patent Application No. 202311020752.X with English translation.
(Continued)

*Primary Examiner* — Scott W Dodds
(74) *Attorney, Agent, or Firm* — OSTROLENK FABER LLP

(57) ABSTRACT

In an substrate processing apparatus according to the present invention, a chamber is configured so as to cover an internal space with a bottom wall, side walls extending from the periphery of the bottom wall, and a ceiling wall covering the upper end of the side walls. A plurality of base support members stand vertically upward from the bottom wall, and the base member is supported by upper end portions of these base support members. A so-called raised floor structure is formed. Then, the substrate processing part is installed on the upper surface of the base member. By adopting such a layout using the raised floor structure, even if leakage of the processing liquid occurs and the processing liquid is pooled on the bottom wall of the chamber, it is possible to reliably prevent the processing liquid from coming into contact with the substrate processing part.

7 Claims, 11 Drawing Sheets

(51) Int. Cl.
*B05C 11/10* (2006.01)
*B05C 13/02* (2006.01)
*H10P 72/76* (2026.01)

(52) U.S. Cl.
CPC .......... *B05C 13/02* (2013.01); *H10P 72/0462* (2026.01); *H10P 72/7612* (2026.01); *H10P 72/7624* (2026.01); *H10P 72/7626* (2026.01)

(56) References Cited

U.S. PATENT DOCUMENTS

2008/0014358 A1 1/2008 Koo et al. .................. 427/372.2
2010/0129546 A1* 5/2010 Kitahara ............. H10P 72/0448 118/52
2012/0186744 A1 7/2012 Higashijima et al.
2016/0336170 A1 11/2016 Ishida et al.
2020/0384510 A1 12/2020 Yoshida et al.

FOREIGN PATENT DOCUMENTS

JP 2002-177855 A 6/2002
JP 2003-163147 A 6/2003
JP 2007-273510 A 10/2007
JP 2008-022010 A 1/2008
JP 2022-52835 A 4/2022
KR 10-2016-0134510 A 11/2016
KR 10-2019-0034654 A 4/2019
TW 200302519 A 8/2003
TW 201246324 A1 11/2012
TW 202223984 A 6/2022
WO WO-2019186578 A1 * 10/2019 .......... H10P 72/7624
WO WO 2020/008784 A1 1/2020

OTHER PUBLICATIONS

Office Action dated Nov. 7, 2024 issued in corresponding Taiwanese Patent Application No. 112129787.
Notice of Allowance dated Nov. 15, 2024 in corresponding Korean Patent Application No. 10-2023-0107058. English translation attached.
Office Action mailed Jun. 18, 2024 in Japanese Patent Application No. JP 2022-134815 and its English translation attached.

* cited by examiner

F I G. 1
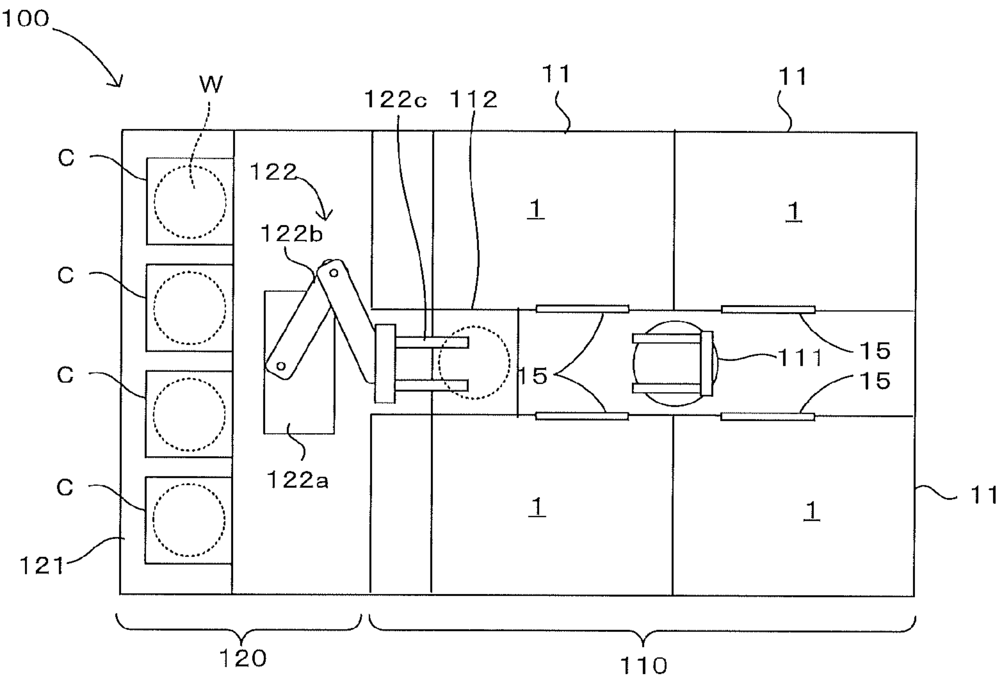

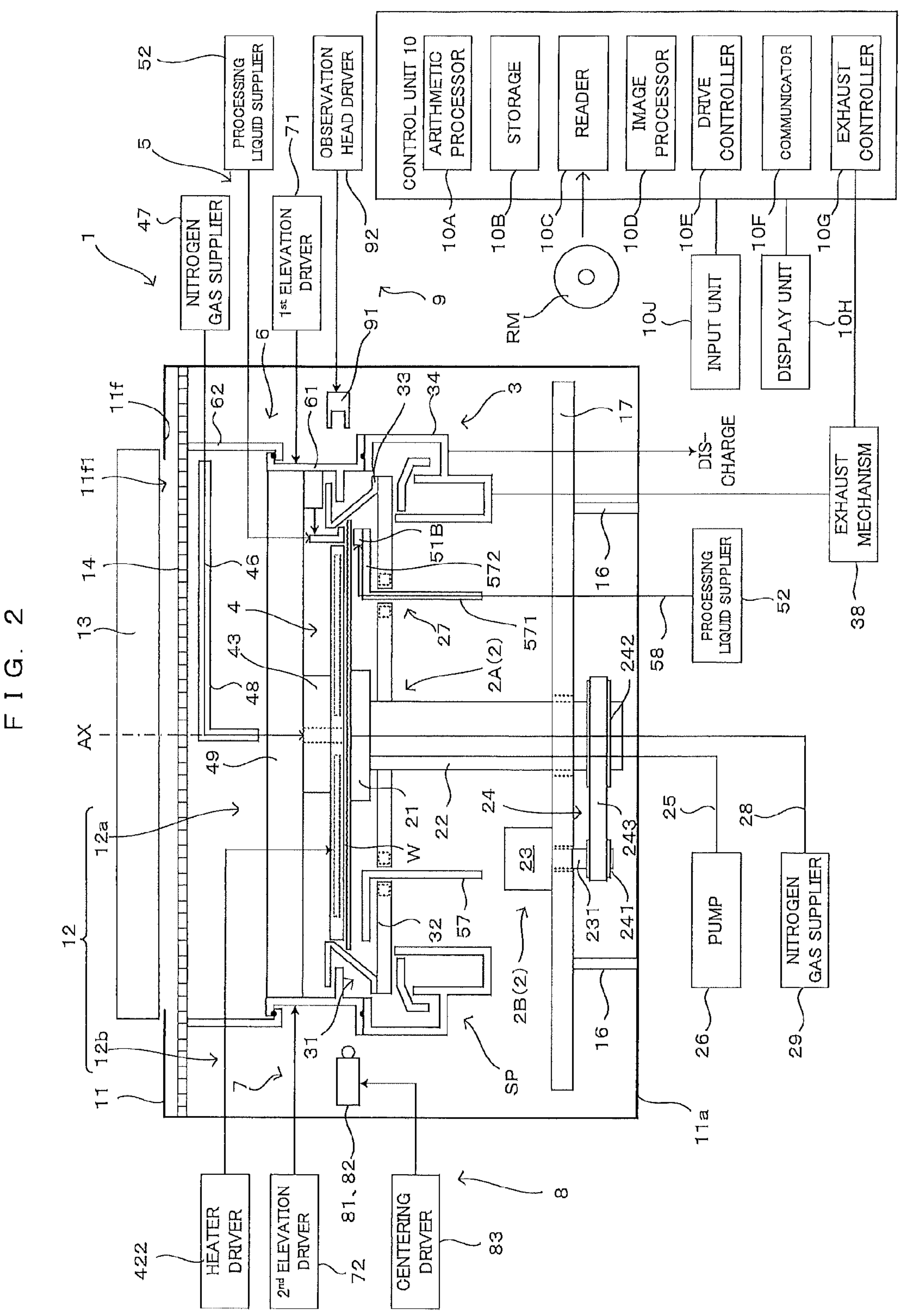
F I G. 2
CONTROL UNIT 10
ARITHMETIC PROCESSOR
STORAGE
READER
IMAGE PROCESSOR
DRIVE CONTROLLER
COMMUNICATOR
EXHAUST CONTROLLER
10A
10B
10C
10D
10E
10F
10G
RM
10J
INPUT UNIT
DISPLAY UNIT
10H
EXHAUST MECHANISM
38
PROCESSING LIQUID SUPPLIER
52
5
NITROGEN GAS SUPPLIER
47
1st ELEVATION DRIVER
71
OBSERVATION HEAD DRIVER
92
91
9
1
6
61
62
11f
11f1
33
34
3
DIS-CHARGE
17
16
51B
572
571
27
58
PROCESSING LIQUID SUPPLIER
52
14
13
46
4
43
48
2A(2)
242
AX
49
21
22
24
243
25
28
12a
W
23
231
241
PUMP
26
NITROGEN GAS SUPPLIER
29
12
32
57
2B(2)
31
16
12b
7
SP
11
11a
81, 82
8
HEATER DRIVER
422
2nd ELEVATION DRIVER
72
CENTERING DRIVER
83

F I G. 4
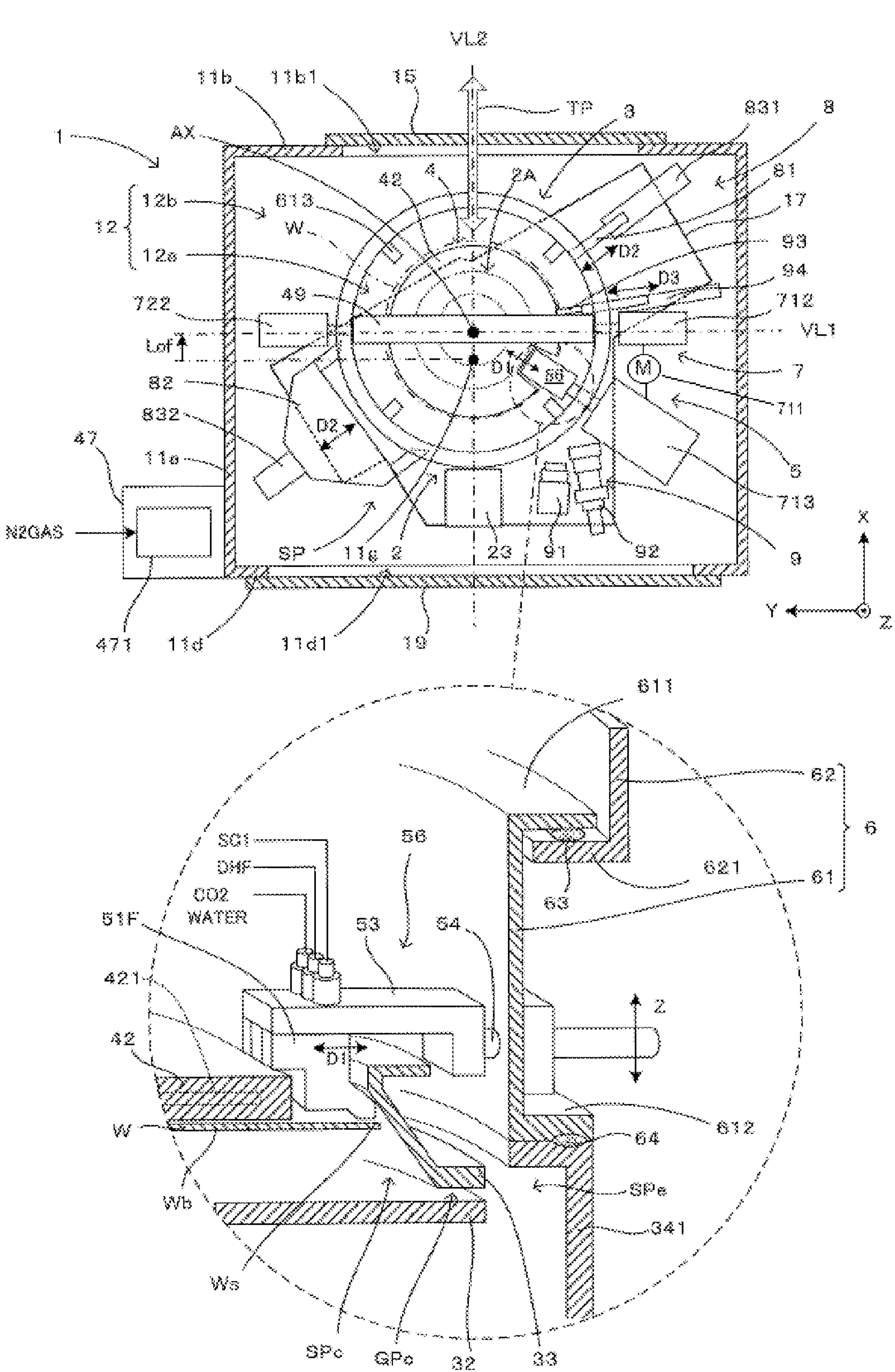

F I G. 6
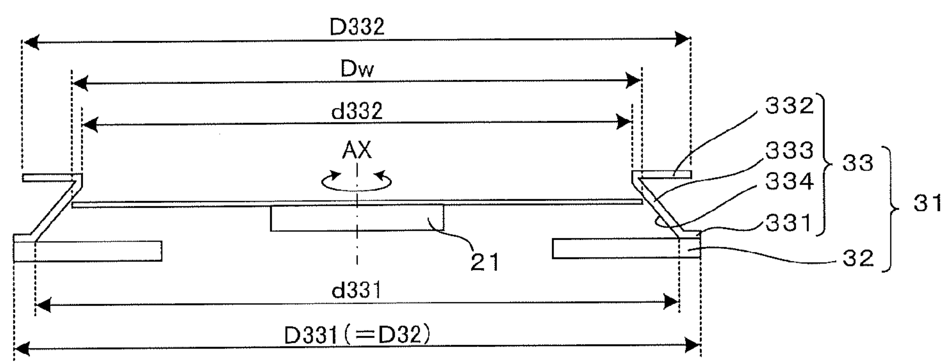
F I G. 7
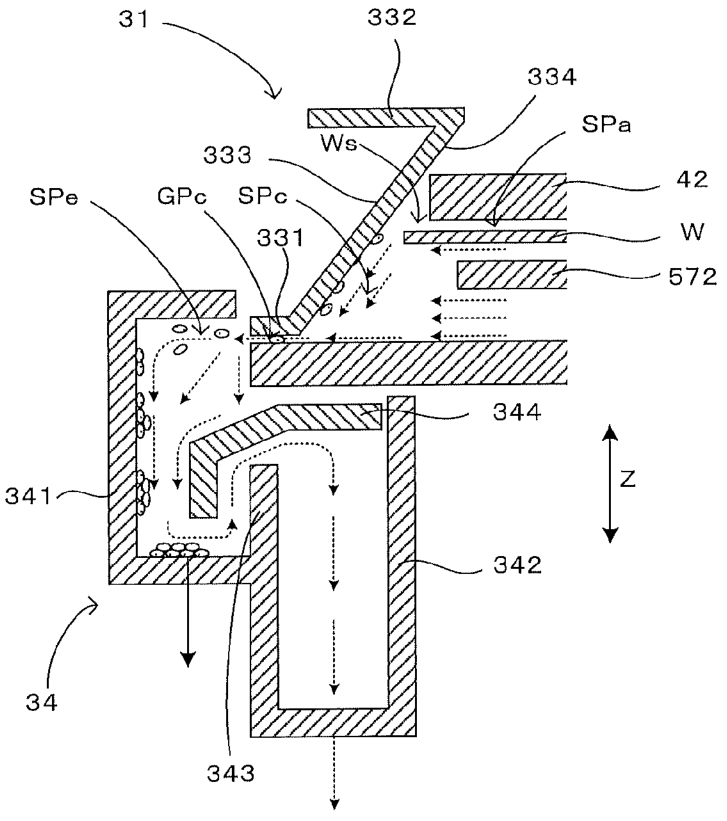

F I G. 8
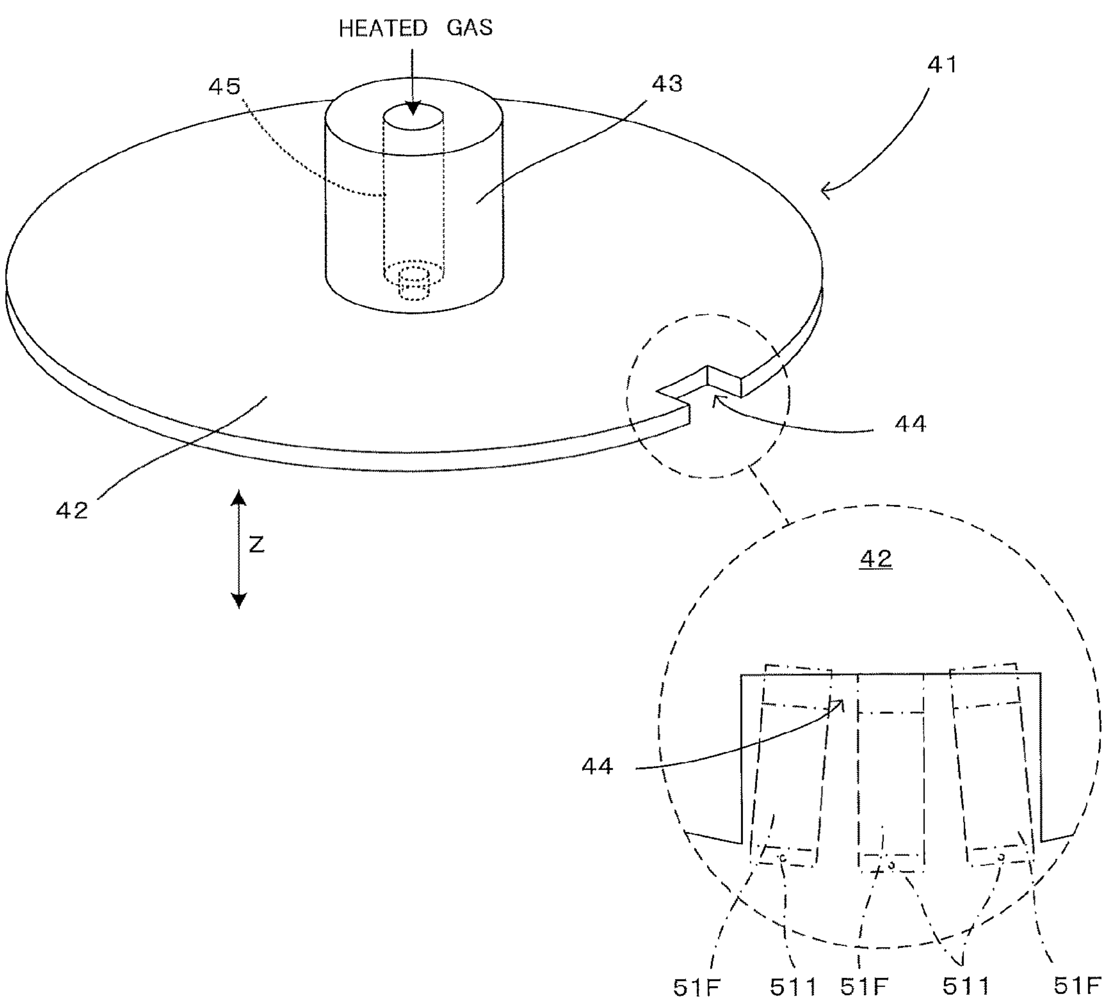
F I G. 9
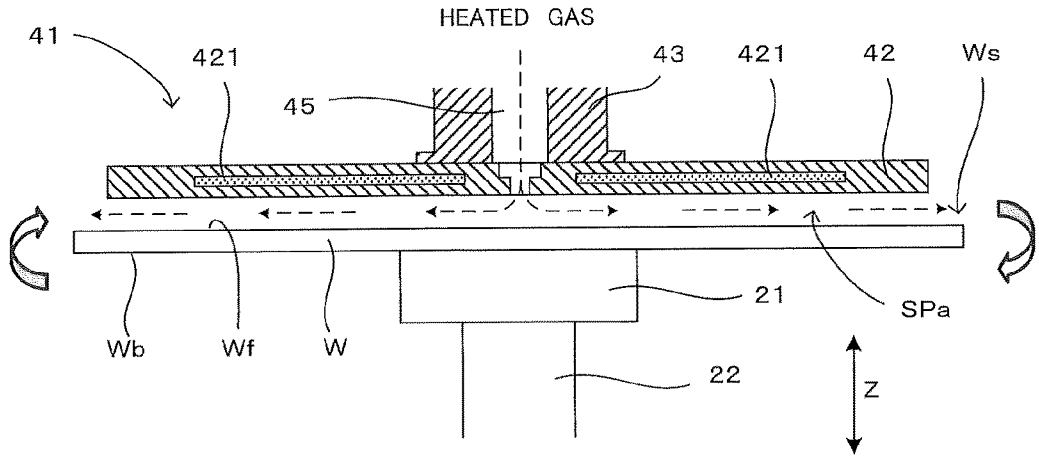

F I G. 1 0
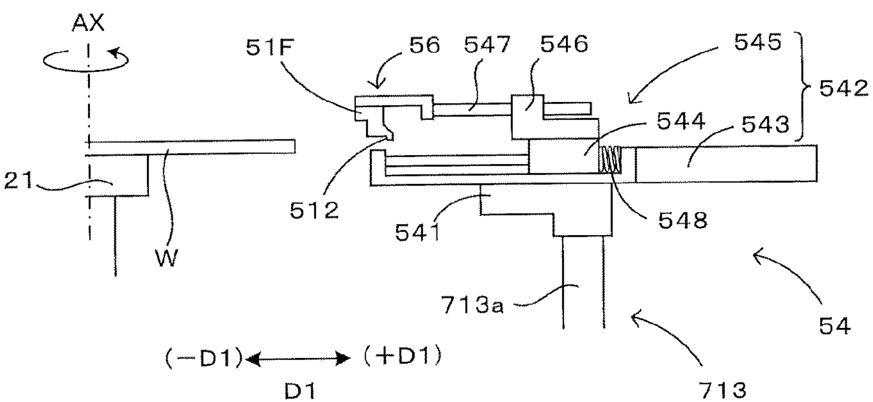
F I G. 1 1
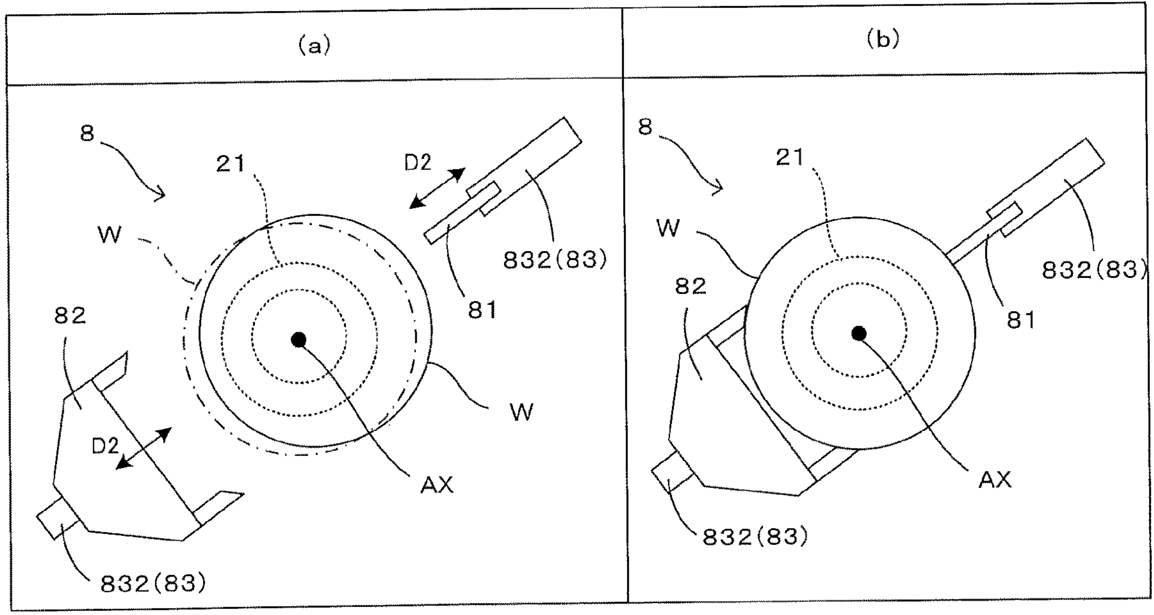

SUBSTRATE PROCESSING APPARATUS

CROSS REFERENCE TO RELATED APPLICATION

The disclosure of Japanese Patent Application No. 2022-134815 filed on Aug. 26, 2022 including specification, drawings and claims is incorporated herein by reference in its entirety.

BACKGROUND OF THE INVENTION

1. Field of the Invention

This invention relates to a substrate processing apparatus for processing a substrate by supplying a processing liquid to the substrate in an internal space of a chamber.

2. Description of the Related Art

As this type of substrate processing apparatus, well known is, for example, an apparatus described in Japanese Patent Application Laid Open Gazette No. 2022-52835. In this apparatus, a substrate processing part is installed on a lower wall (which corresponds to a "bottom wall" of the present invention) of a chamber. Further, a sidewall stands from a periphery of the lower wall so as to surround the substrate processing part, and an upper wall is disposed above the substrate processing part. In this substrate processing part, a spin chuck is disposed in an internal space surrounded by the lower wall, the sidewall, and the upper wall. This spin chuck receives a rotational driving force from a motor fixed on the lower wall of the chamber, to thereby rotate about an axis of rotation extending in a vertical direction, while horizontally holding a substantially disk-like substrate, such as a semiconductor wafer or the like. The substrate is thereby rotated about the axis of rotation integrally together with the spin chuck. Thus, a processing liquid is supplied onto a peripheral edge part of the substrate while being rotated. Bevel processing for processing the peripheral edge part of an upper surface of the substrate with the processing liquid is thereby performed as one example of substrate processing.

SUMMARY OF THE INVENTION

In the substrate processing apparatus described in above-described Japanese Patent Application Laid Open Gazette No. 2022-52835, a chemical liquid such as SC1, DHF, or the like is used as the processing liquid. For this reason, there is a possibility that the processing liquid is pooled on the lower wall of the chamber due to leakage and an ill effect is produced on part of the substrate processing part, such as the above-described motor. Then, though not described in Japanese Patent Application Laid Open Gazette No. 2022-52835, it is necessary to provide a cover over constituent components of the substrate processing part, in particular, an electrical component.

Further, in order to ensure the chemical resistance to the chemical liquid, a resin material is frequently used as a constituent material of the chamber. Especially, the resin material is used as the lower wall and the constituent components of the substrate processing part are disposed on the lower wall formed of a resin. The strength of the lower wall formed of a resin is low and moreover, deflection sometimes occurs. Therefore, it is difficult to assemble the constituent components of the substrate processing part with the lower wall as a reference base, and it is necessary to perform height adjustment in a vertical direction individually on the constituent components.

Due to these factors, the conventional apparatus causes an increase in the apparatus cost and deterioration of the maintenance workability in order to avoid an ill effect due to leakage of the processing liquid.

This invention is intended to solve the above-described problem, and it is an object of the present invention to perform substrate processing on a substrate with a low cost and excellent maintainability while avoiding an ill effect due to leakage of a processing liquid in a substrate processing apparatus in which a substrate processing part for processing a substrate by using a chemical liquid as a processing liquid is disposed in an internal space of a chamber.

An invention is a substrate processing apparatus. The apparatus comprises: a chamber configured to surround an internal space by a bottom wall, a sidewall standing from a periphery of the bottom wall, and a ceiling wall covering an upper end part of the sidewall; a substrate processing part configured to perform predetermined substrate processing on a substrate by supplying a chemical liquid as a processing liquid onto the substrate while rotating the substrate in a horizontal posture about an axis of rotation extending in a vertical direction; a plurality of base support members standing vertically upward from the bottom wall; and a base member having rigidity higher than that of the bottom wall, being supported by upper end parts of the plurality of base support members in a posture with a mounting surface finished to allow the substrate processing part to be mounted thereon, facing vertically upward at a separation position away upward from the bottom wall.

In the invention having such a configuration, the base member is disposed at a separation position away upward from the bottom wall of the chamber, and in the internal space of the chamber, a so-called raised floor structure is formed. Then, the substrate processing part is installed on the upper surface of the base member. By adopting such a layout using the raised floor structure, even if leakage of the processing liquid occurs and the processing liquid is pooled on the bottom wall of the chamber, it is possible to reliably prevent the processing liquid from coming into contact with the substrate processing part. Therefore, it is not necessary to form the base member of a resin material, and by forming the base member of a material having rigidity higher than that of the bottom wall, it is possible to install the substrate processing part on a mounting surface with the mounting surface of the base member as a reference base. Therefore, the substrate processing part can be installed with maintainability better than that of the conventional apparatus. Further, since the substrate processing part is installed at a position higher than that of the bottom wall in the vertical direction, there is no necessity of attaching an additional component to the substrate processing part, such as a cover or the like used to prevent an ill effect of the processing liquid.

According to this invention, though a substrate processing part for processing a substrate by using a chemical liquid as a processing liquid is disposed in an internal space of a chamber, it is possible to perform substrate processing on the substrate with a low cost and excellent maintainability while avoiding an ill effect due to leakage of the processing liquid.

All of a plurality of constituent elements of each aspect of the invention described above are not essential and some of the plurality of constituent elements can be appropriately changed, deleted, replaced by other new constituent elements or have limited contents partially deleted in order to solve some or all of the aforementioned problems or to achieve some or all of effects described in this specification. Further, some or all of technical features included in one aspect of the invention described above can be combined with some or all of technical features included in another aspect of the invention described above to obtain one independent form of the invention in order to solve some or all of the aforementioned problems or to achieve some or all of the effects described in this specification.

BRIEF DESCRIPTION OF THE DRAWINGS

FIG. 1 is a plan view showing a schematic configuration of a substrate processing system equipped with a first embodiment of a substrate processing apparatus according to the invention;

FIG. 2 is a diagram showing a configuration of the first embodiment of the substrate processing apparatus according to the invention;

FIG. 4 is a plan view schematically showing a configuration of a substrate processing part installed on a base member;

FIG. 6 is a diagram showing a dimensional relationship of the substrate held on the spin chuck and the rotating cup;

FIG. 7 is a diagram partially showing a rotating cup and a fixed cup;

FIG. 8 is an external perspective view showing a configuration of an upper surface protecting/heating mechanism;

FIG. 9 is a sectional view of the upper surface protecting/heating mechanism shown in FIG. 8;

FIG. 10 is a diagram schematically showing a configuration of a nozzle mover;

FIG. 11 is a diagram schematically showing the configuration and operation of a centering mechanism;

DETAILED DESCRIPTION OF THE PREFERRED EMBODIMENTS

Figure 3:
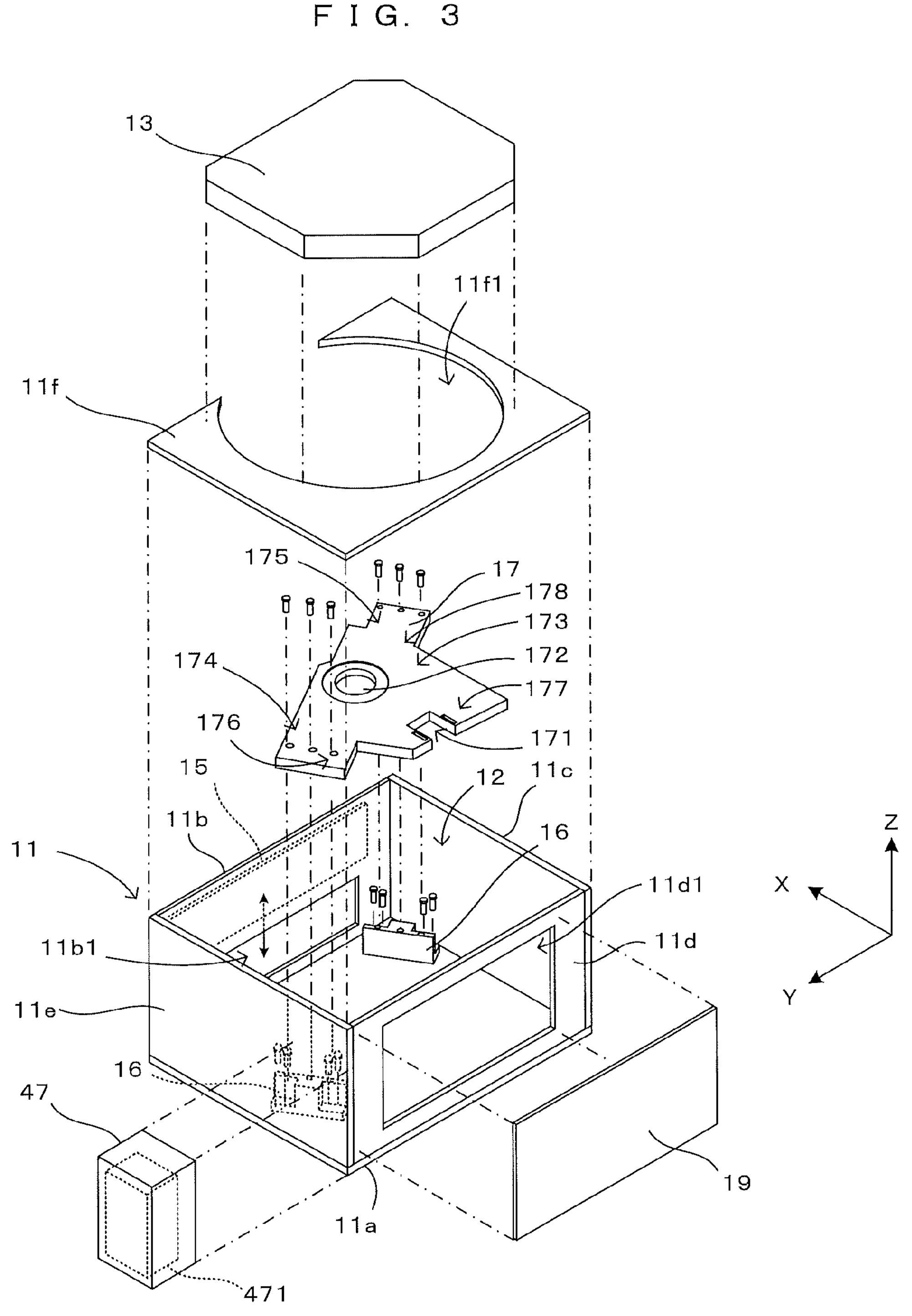
FIG. 3 is a diagram schematically showing a configuration of a chamber and a configuration attached to the chamber.

FIG. 1 is a plan view showing a schematic configuration of a substrate processing system equipped with a first embodiment of a substrate processing apparatus according to the invention. This figure is a diagram not showing the external appearance of the apparatus, but showing an internal structure of a substrate processing system 100 by excluding an outer wall panel and other partial configurations. This substrate processing system 100 is, for example, a single-wafer type apparatus installed in a clean room and configured to process substrates W each having a circuit pattern (hereinafter, referred to as a "pattern") only on one principal surface one by one. Then, substrate processing using a processing liquid is performed in a processing unit 1 equipped in the substrate processing system 100. In this specification, a pattern formation surface (one principal surface) formed with the pattern is referred to as a "front surface" and the other principal surface not formed with the pattern on an opposite side is referred to as a "back surface". Further, a surface facing down is referred to as a "lower surface" and a surface facing up is referred to as an "upper surface". Further, in this specification, the "pattern formation surface" means a surface of the substrate where an uneven pattern is formed in an arbitrary region regardless of whether the surface is flat, curved or uneven.

Here, various substrates such as semiconductor wafers, glass substrates for photomask, glass substrates for liquid crystal display, glass substrates for plasma display, substrates for FPD (Flat Panel Display), optical disk substrates, magnetic disk substrates and magneto-optical disk substrates can be applied as the "substrate" in the present embodiment. Although the substrate processing apparatus used in processing semiconductor wafers is mainly described as an example with reference to the drawings below, application to the processing of various substrates illustrated above is also possible.

As shown in FIG. 1, the substrate processing system 100 includes a substrate processing station 110 for processing the substrate W and an indexer station 120 coupled to this substrate processing station 110. The indexer station 120 includes a container holder 121 capable of holding a plurality of containers C for housing the substrates W (FOUPs (Front Opening Unified Pods), SMIF (Standard Mechanical Interface) pods, OCs (Open Cassettes) for housing a plurality of the substrates W in a sealed state), and an indexer robot 122 for taking out an unprocessed substrate W from the container C by accessing the container C held by the container holder 121 and housing a processed substrate W in the container C. A plurality of the substrates W are housed substantially in a horizontal posture in each container C.

The indexer robot 122 includes a base 122*a* fixed to an apparatus housing, an articulated arm 122*b* provided rotatably about a vertical axis with respect to the base 122*a*, and a hand 122*c* mounted on the tip of the articulated arm 122*b*. The hand 122*c* is structured such that the substrate W can be placed and held on the upper surface thereof. Such an indexer robot including the articulated arm and the hand for holding the substrate is not described in detail since being known.

The substrate processing station 110 includes a mounting table 112 on which the indexer robot 122 places the substrate W, a substrate conveyor robot 111 arranged substantially in a center in a plan view and a plurality of processing units 1 arranged to surround this substrate conveyor robot 11. Specifically, the plurality of processing units 1 are arranged to face a space where the substrate conveyor robot 111 is arranged. The substrate conveyor robot 111 randomly accesses the mounting table 112 for these processing units 1 and transfers the substrate W to and from the mounting table 112. On the other hand, each processing unit 1 performs a predetermined processing to the substrate W, and corresponds to the substrate processing apparatus according to the present invention. In the present embodiment, these processing units (substrate processing apparatus) 1 have the same function. Thus, a plurality of the substrates W can be processed in parallel. If the substrate conveyor robot 111 can directly transfer the substrate W from the indexer robot 122, the mounting table 112 is not necessarily required.

FIG. 2 is a diagram showing a configuration of the first embodiment of the substrate processing apparatus according to the invention. Further, FIG. 3 is a diagram schematically showing a configuration of a chamber and a configuration attached to the chamber. In FIGS. 2 and 3 and each figure to be referred to below, the dimensions and numbers of respective components may be shown in an exaggerated or simplified manner to facilitate understanding. As shown in FIG. 3, a chamber 11 used in the substrate processing apparatus (processing unit) 1 has a bottom wall 11*a* having a rectangular shape in a plan view vertically from above, four sidewalls 11*b* to 11*e* standing from a periphery of the bottom wall 11*a*, and a ceiling wall 11*f* covering respective upper end parts of the sidewalls 11*b* to 11*e*. By combining the bottom wall 11*a*, the sidewalls 11*b* to 11*e*, and the ceiling wall 11*f*, formed is an internal space 12 having a substantially rectangular parallelopiped shape.

On an upper surface of the bottom wall 11*a*, base support members 16 and 16 are fixed away from each other by fastener components such as bolts or the like. Specifically, the base support member 16 stands from the bottom wall 11*a*. On respective upper end parts of these base support members 16 and 16, a base member 17 is fixed by the fastener components such as bolts or the like. This base member 17 has a plane size smaller than that of the bottom wall 11*a* and is composed of a metal plate having a thickness larger than that of the bottom wall 11*a* and rigidity higher than that thereof. As shown in FIG. 2, the base member 17 is raised by the base support members 16 and 16 from the bottom wall 11*a* vertically upward. In other words, a so-called raised floor structure is formed on a bottom part of the internal space 12 of the chamber 11. As described later, an upper surface of this base member 17 is finished to allow a substrate processing part SP for performing substrate processing on the substrate W to be installed thereon, and the substrate processing part SP is installed on the upper surface thereof. Components constituting this substrate processing part SP are electrically connected to a control unit 10 for controlling the entire apparatus and operate in response to commands from the control unit 10. Further, the shape of the base member 17 and the configuration and operation of the substrate processing part SP will be described in detail.

As shown in FIGS. 2 and 3, a fan filter unit (FFU) 13 is attached to a ceiling wall 11*f* of the chamber 11. This fan filter unit 13 further cleans air in a clean room in which the substrate processing apparatus 1 is installed, and supplies the cleaned air into an internal space 12 of the chamber 11. The fan filter unit 13 includes a fan and a filter (e.g. a HEPA (High Efficiency Particulate Air) filter) for taking in the air in the clean room and feeding the air into the chamber 11, and feeds the cleaned air via an opening 11*f*1 provided in the ceiling wall 11*f*. In this way, a downflow of the cleaned air is formed in the internal space 12 in the chamber 11. Further, a punching plate 14 perforated with a multitude of air outlets is provided right below the ceiling wall 1 if to uniformly disperse the cleaned air supplied from the fan filter unit 13.

As shown in FIG. 3, in the substrate processing apparatus 1, a conveyance opening 11*b*1 is provided in the sidewall 11*b* facing the substrate conveyor robot 111 among the four sidewalls 11*b* to 11*e*, and the internal space 12 communicates with the outside of the chamber 11 therethrough. For this reason, a hand (not shown) of the substrate conveyor robot 111 can access the substrate processing part SP through the conveyance opening 11*b*1. In other words, by providing the conveyance opening 11*b*1, the substrate W can be loaded into or unloaded from the internal space 12. Further, a shutter 15 for opening and closing this conveyance opening 11*b*1 is attached to the sidewall 11*b*.

A shutter opening/closing mechanism (not shown) is connected to the shutter 15, and opens or closes the shutter 15 in response to an opening/closing command from the control unit 10. More specifically, in the substrate processing apparatus 1, the shutter opening/closing mechanism opens the shutter 15 in carrying an unprocessed substrate W into the chamber 11, and the unprocessed substrate W is carried in a face-up posture to the substrate processing part SP of the rotating mechanism 2 by a hand of a substrate conveyor robot 111. That is, the substrate W is placed on the spin chuck (denoted by 21 in FIG. 5) with an upper surface Wf facing up. If the hand of the substrate conveyor robot 111 is retracted from the chamber 11 after the substrate W is carried into, the shutter opening/closing mechanism closes the shutter 15. Then, a bevel processing is performed on the peripheral edge part Ws of the substrate W, as an example of a "substrate processing" of the invention by the substrate processing part SP, in the processing space (equivalent to a sealed space SPs to be described in detail later) of the chamber 11. Further, after the bevel processing is finished, the shutter opening/closing mechanism opens the shutter 15 again and the hand of the substrate conveyor robot 111 carries out the processed substrate W from the substrate processing part SP. As just described, in the present embodiment, the internal space 12 of the chamber 11 is kept in a normal temperature atmosphere. Note that the "normal temperature" means a temperature in a range of 5° C. to 35° C. in this specification.

As shown in FIG. 3, the sidewall 11*d* is positioned on the opposite side of the sidewall 11*b* with respect to the substrate processing part SP (FIG. 2) installed on the base member 17. In this sidewall 11*d*, provided is a maintenance opening 11*d*1. During maintenance, as shown in this figure, the maintenance opening 11*d*1 is opened. For this reason, an operator can access the substrate processing part SP through the maintenance opening 11*d*1 from the outside of the apparatus. On the other hand, during the substrate processing, a lid member 19 is so attached as to close the maintenance opening 11*d*1. Thus, in the present embodiment, the lid member 19 is detachable from the sidewall 11*d*.

Further, on an outer surface of the sidewall 11*e*, a heated gas supplier 47 for supplying the substrate processing part SP with a heated inert gas (nitrogen gas in the present embodiment) is attached. This heated gas supplier 47 incorporates a heater 471.

Thus, on the outer wall side of the chamber 11, the shutter 15, the lid member 19, and the heated gas supplier 47 are arranged. In contrast to this, in an inner side of the chamber 11, i.e., in the internal space 12, the substrate processing part SP is installed on the upper surface of the base member 17 having the raised floor structure. Hereinafter, with reference to FIGS. 2 and 4 to 12, the configuration of the substrate processing part SP will be described.

FIG. 4 is a plan view schematically showing the configuration of the substrate processing part installed on the base member. Hereinafter, for clarifying the arrangement relation and operation of the components of the apparatus, a coordinate system with a Z direction as a vertical direction and with an XY plane as a horizontal plane is shown as appropriate. In the coordinate system of FIG. 4, it is assumed that a horizontal direction in parallel to a conveyance path TP of the substrate W is an "X direction" and a horizontal direction orthogonal to the X direction is a "Y direction". In more detail, directions from the internal space 12 of the chamber 11 toward the conveyance opening 11*b*1 and the maintenance opening 11*d*1 are referred to as a "+X direction" and a "−X direction", respectively, directions from the internal space 12 of the chamber 11 toward the sidewalls 11*c* and 11 *e* are referred to as a "−Y direction" and a "+Y direction", respectively, and directions vertically upward and downward are referred to as a "+Z direction" and a "−Z direction", respectively.

The substrate processing part SP includes a holding/rotating mechanism 2, a scattering preventing mechanism 3, an upper surface protecting/heating mechanism 4, a processing mechanism 5, an atmosphere separating mechanism 6, an elevating mechanism 7, a centering mechanism 8, and a substrate observing mechanism 9. These mechanisms are provided on the base member 17. Specifically, with reference to the base member 17 having rigidity higher than that of the chamber 11, the holding/rotating mechanism 2, the scattering preventing mechanism 3, the upper surface protecting/heating mechanism 4, the processing mechanism 5, the atmosphere separating mechanism 6, the elevating mechanism 7, the centering mechanism 8, and the substrate observing mechanism 9 are arranged to one another with a positional relation determined in advance.

Figure 5:
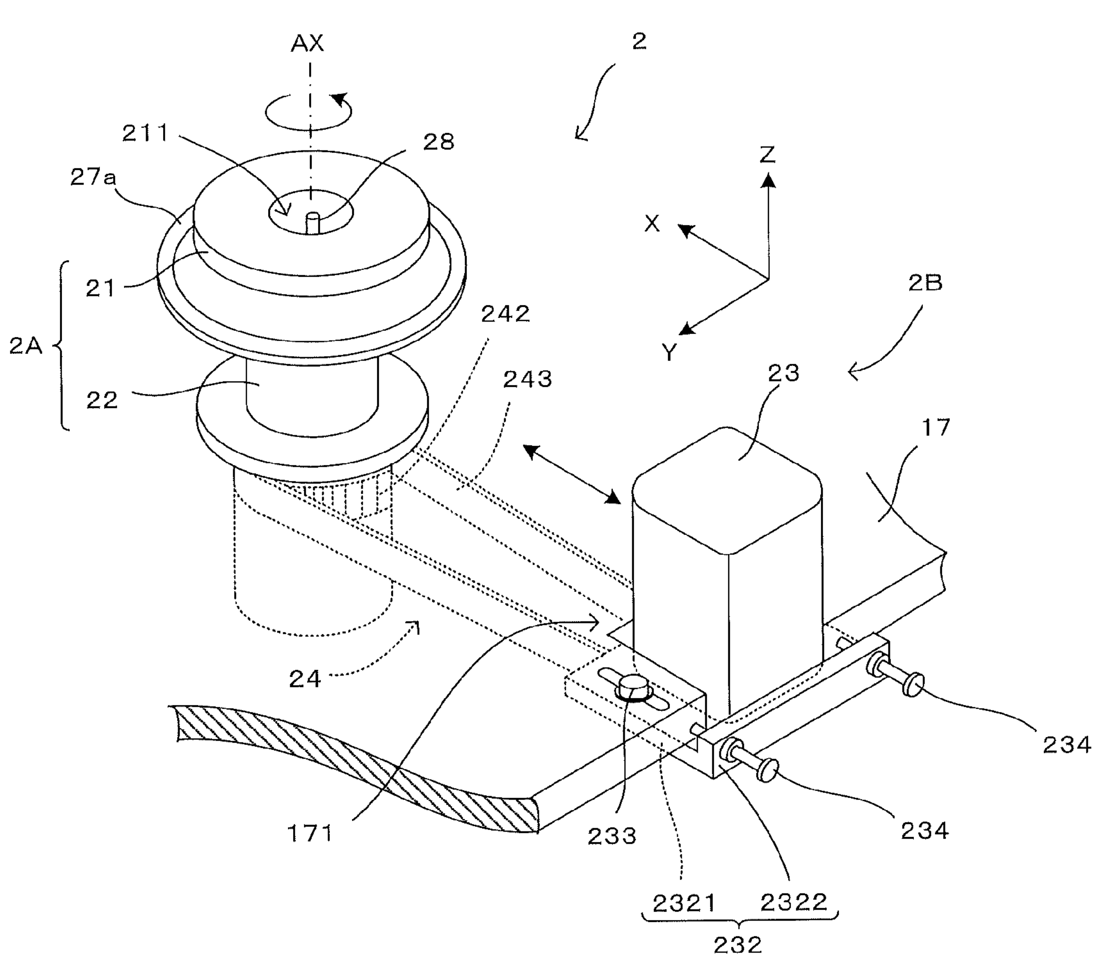
FIG. 5 is a perspective view showing a configuration of a holding/rotating mechanism.

FIG. 5 is a perspective view showing a configuration of the holding/rotating mechanism. The holding/rotating mechanism 2 includes a substrate holder 2A for holding the substrate W substantially in a horizontal posture with a surface of the substrate W facing up and a rotating mechanism 2B for synchronously rotating the substrate holder 2A holding the substrate W and part of the scattering preventing mechanism 3. For this reason, when the rotating mechanism 2B operates in response to a rotation command from the control unit 10, the substrate W and a rotating cup 31 of the scattering preventing mechanism 3 are rotated about an axis of rotation AX extending in parallel to the vertical direction Z.

The substrate holder 2A includes the spin chuck 21 which is a disk-like member smaller than the substrate W. The spin chuck 21 is so provided that an upper surface thereof is substantially horizontal and a center axis thereof coincides with the axis of rotation AX. Especially in the present embodiment, as shown in FIG. 4, a center of the substrate holder 2A (which corresponds to the center axis of the spin chuck 21) is offset in the (+X) direction relative to a center 11*g* of the chamber 11. Specifically, the substrate holder 2A is arranged so that the center axis (axis of rotation AX) of the spin chuck 21 may be positioned at a processing position deviated from the center 11*g* of the internal space 12 toward a side of the conveyance opening 11*b*1 by a distance Lof in a plan view of the chamber 11 viewed from above. Further, for clarifying the later-described arrangement relation of the components of the apparatus, in the present specification, a virtual line passing through the center (axis of rotation AX) of the substrate holder 2A which is offset and being orthogonal to the conveyance path TP and another virtual line in parallel to the conveyance path TP are referred to as a "first virtual horizontal line VL1" and a "second virtual horizontal line VL2", respectively.

As shown in FIG. 5, a cylindrical rotary shaft 22 is coupled to a lower surface of the spin chuck 21. The rotary shaft 22 extends in the vertical direction Z with an axis line thereof coinciding with the axis of rotation AX. Further, the rotating mechanism 2B is connected to the rotary shaft 22.

The rotating mechanism 2B has a motor 23 which generates a rotational driving force for rotating the substrate holder 2A and the rotating cup 31 of the scattering preventing mechanism 3 and a power transmitter 24 for transmitting the rotational driving force. The motor 23 has a rotation shaft 231 rotating with generation of the rotational driving force. The motor 23 is provided at a motor attachment portion 171 of the base member 17 in a posture with the rotation shaft 231 extending vertically downward. In more detail, as shown in FIG. 3, the motor attachment portion 171 is a portion which is cut out in the (+X) direction while facing the maintenance opening 11*d*1. A cutout width (size in the Y direction) of this motor attachment portion 171 is almost equal to the width of the motor 23 in the Y direction. For this reason, the motor 23 is movable in the X direction with a side surface thereof engaged with the motor attachment portion 171.

In order to fix the motor 23 to the base member 17 at the motor attachment portion 171 while positioning the motor 23 in the X direction, a motor fixing bracket 232 is coupled to the base member 17 with a fastening member 233 such as a bolt, a screw, or the like. As shown in FIG. 5, the motor fixing bracket 232 has a horizontal portion 2321 and a vertical portion 2322 and has a substantial L shape in a side view from the (+Y) direction. Though not shown in FIG. 5, at a central part of the horizontal portion 2321 of the motor fixing bracket 232, provided is a through hole through which the rotation shaft 231 is to be inserted. The horizontal portion 2321 supports the motor 23 with the rotation shaft 231 inserted vertically downward through this through hole. Further, the vertical portion 2322 is so structured as to be engaged with the motor 23 supported by the horizontal portion 2321 from below. To this vertical portion 2322, two fastening members 234 such as bolts, screws, or the like are attached, being away from each other in the Y direction. A tip part of each of the fastening members 234 penetrates the vertical portion 2322, extending in the (+X) direction, and is threadedly engaged in the motor attachment portion 171. Therefore, the operator positively or negatively rotates the fastening member 234, to thereby move the motor fixing bracket 232 supporting the motor 23 in the X direction. It thereby becomes possible to position the motor 23 in the X direction. Further, after positioning the motor 23, the operator positively rotates the fastening member 233, to thereby firmly fix the motor 23 to the base member 17 integrally with the motor attachment portion 171.

At a tip part of the rotation shaft 231 protruding downward from the base member 17, attached is a first pulley 241. At a lower end part of the substrate holder 2A, attached is a second pulley 242. In more detail, the lower end part of the substrate holder 2A is inserted into the through hole provided in a spin chuck attachment portion 172 of the base member 17 and protrudes downward from the base member 17. This protruding portion is provided with the second pulley 242. Then, an endless belt 243 is put over between the first pulley 241 and the second pulley 242. Thus, in the present embodiment, the first pulley 241, the second pulley 242, and the endless belt 243 constitute the power transmitter 24.

In a case of using the power transmitter 24 having such a configuration, a long-length timing belt can be selected as the endless belt 243 and a longer life of the endless belt 243 is ensured. With the movement of the motor 23 in the X direction, however, a maintenance work such as spacing adjustment of the first pulley 241 and the second pulley 242, exchange of the endless belt 243, or the like is needed. Then, in the present embodiment, as shown in FIG. 4, the conveyance opening 11*b*1, the substrate holder 2A, the power transmitter 24, the motor 23, and the maintenance opening 11*d*1 are linearly arranged in this order along the second virtual horizontal line VL2 in a plan view of the chamber 11 viewed from above. In other words, the power transmitter 24 and the motor 23 are so arranged as to face the maintenance opening 11*d*1. Therefore, when the maintenance opening 11*d*1 is opened by detaching the lid member 19 from the chamber 11, the power transmitter 24 and the motor 23 are exposed to the outside through the maintenance opening 11*d*1. As a result, it becomes easier for the operator to perform the maintenance work and it is possible to increase the efficiency of the maintenance work.

Moreover, the power transmitter 24 is disposed below the base member 17 while the other mechanisms described below are disposed above the base member 17. By adopting such an arrangement, it is possible for the operator to perform the maintenance work more efficiently without interference with any of the other mechanisms.

As shown in FIG. 5, a through hole 211 is provided at a central part of the spin chuck 21 and communicates with an internal space of the rotary shaft 22. A pump 26 is connected to the internal space via a pipe 25 having a valve (not shown) disposed therein. This pump 26 and the valve are electrically connected to the control unit 10 and operate in response to a command from the control unit 10. In this way, a negative pressure and a positive pressure are selectively applied to the spin chuck 21. If the pump 26 applies a negative pressure to the spin chuck 21, for example, with the substrate W placed substantially in a horizontal posture on the upper surface of the spin chuck 21, the spin chuck 21 sucks and holds the substrate W from below. On the other hand, if the pump 26 applies a positive pressure to the spin chuck 21, the substrate W can be taken out from the upper surface of the spin chuck 21. Further, if the suction of the pump 26 is stopped, the substrate W is horizontally movable on the upper surface of the spin chuck 21.

A nitrogen gas supplier 29 is connected to the spin chuck 21 via a pipe 28 provided in a central part of the rotary shaft 22. The nitrogen gas supplier 29 supplies a nitrogen gas at a normal temperature supplied from a utility of a factory, in which the substrate processing system 100 is installed, to the spin chuck 21 at a flow rate and a timing corresponding to a nitrogen gas supply command from the control unit 10, and causes the nitrogen gas to flow from the central part to a radially outer side on the side of a lower surface Wb of the substrate W. Note that although the nitrogen gas is used in the present embodiment, another inert gas may be used. This point also applies to a heated gas discharged from a central nozzle to be described later. Further, the "flow rate" means a moving amount of a fluid such as the nitrogen gas per unit time.

The rotating mechanism 2B includes a power transmitter 27 (FIG. 2) for not only rotating the spin chuck 21 integrally with the substrate W, but also rotating the rotating cup 31 in synchronization with the former rotation. The power transmitter 27 includes an annular member 27*a* (FIG. 5) made of a non-magnetic material or resin, spin chuck side magnets (not shown) built-in the annular member 27*a*, and cup side magnets (not shown) built-in a lower cup 32, which is one component of the rotating cup 31. The annular member 27*a* is attached to the rotary shaft 22 and rotatable about the axis of rotation AX together with the rotary shaft 22. More particularly, the rotary shaft 22 includes a flange part 22*a* protruding radially outward at a position right below the spin chuck 21 as shown in FIG. 5. The annular member 27*a* is arranged concentrically with respect to the flange part 22*a*, and coupled and fixed by an unillustrated bolt or the like.

A plurality of spin chuck side magnets are arranged radially and at equal angular intervals (10° in the present embodiment) with the axis of rotation AX as a center on an outer peripheral edge part of the annular member 27*a*. In the present embodiment, an N-pole and an S-pole are respectively arranged on an outer side and an inner side of one of the two spin chuck side magnets adjacent to each other, and an S-pole and an N-pole are respectively arranged on an outer side and an inner side of the other magnet.

Similarly to these spin chuck side magnets, a plurality of cup side magnets are arranged radially and at equal angular intervals with the axis of rotation AX as a center. These cup side magnets are built in the lower cup 32. The lower cup 32 is a constituent component of the scattering preventing mechanism 3 to be described next and, as shown in FIGS. 4 and 5, has an annular shape. That is, the lower cup 32 has an inner peripheral surface capable of facing the outer peripheral surface of the annular member 27*a*. An inner diameter of this inner peripheral surface is larger than an outer diameter of the annular member 27*a*. The lower cup 32 is arranged concentrically with the rotary shaft 22 and the annular member 27*a* while this inner peripheral surface is separated from the outer peripheral surface of the annular member 27*a* by a predetermined distance (=(the inner diameter−the outer diameter)/2) and facing the outer peripheral surface of the annular member 27*a*. Engaging pins 35 and coupling magnets 36 are provided on the upper surface of the outer peripheral edge of the lower cup 32, the upper cup 33 is coupled to the lower cup 32 by these, and this coupled body functions as the rotating cup 31. This point is described in detail later.

The lower cup 32 is supported rotatably about the axis of rotation AX on the upper surface of the the base member 17 while being kept in the above arranged state by a bearing not shown in figures. The plurality of cup side magnets are arranged radially and at equal angular intervals with the axis of rotation AX as a center on an inner peripheral edge part of this lower cup 32. Further, two cup side magnets adjacent to each other are arranged similarly to the spin chuck side magnets. That is, an N-pole and an S-pole are respectively arranged on an outer side and an inner side of one magnet, and an S-pole and an N-pole are respectively arranged on an outer side and an inner side of the other magnet.

In the power transmitter 27 thus configured, if the annular member 27*a* is rotated together with the rotary shaft 22 by the motor 23, the lower cup 32 rotates in the same direction as the annular member 27*a* while maintaining an air gap GPa (gap between the annular member 27*a* and the lower cup 32) by the action of magnetic forces between the spin chuck side magnets and the cup side magnets. In this way, the rotating cup 31 rotates about the axis of rotation AX. That is, the rotating cup 31 rotates in the same direction as and in synchronization with the substrate W.

The scattering preventing mechanism 3 includes the rotating cup 31 rotatable about the axis of rotation AX while surrounding the outer periphery of the substrate W held on the spin chuck 21 and a fixed cup 34 fixedly provided to surround the rotating cup 31. The rotating cup 31 is provided rotatably about the axis of rotation AX while surrounding the outer periphery of the rotating substrate W by the upper cup 33 being coupled to the lower cup 32.

FIG. 6 is a diagram showing a dimensional relationship of the substrate held on the spin chuck and the rotating cup. FIG. 7 is a diagram partially showing a rotating cup and a fixed cup. The lower cup 32 has an annular shape. The lower cup 32 has an outer diameter larger than that of the substrate W and is arranged rotatably about the axis of rotation AX while radially protruding from the substrate W held on the spin chuck 21 in a plan view vertically from above. In this protruding region, i.e. an upper surface peripheral edge part 321 of the lower cup 32, the engaging pins 35 standing vertically upward and the flat plate-like lower magnets 36 are alternately mounted along a circumferential direction. A total of three engaging pins 35 are mounted, and a total of three lower magnets 36 are mounted. These engaging pins (not shown) and lower magnets (not shown) are arranged radially and at equal angular intervals with the axis of rotation AX as a center.

On the other hand, as shown in FIGS. 2, 3, and 6, the upper cup 33 includes a lower annular part 331, an upper annular part 332 and an inclined part 333 coupling these. An outer diameter D331 of the lower annular part 331 is equal to an outer diameter D32 of the lower cup 32 and, as shown in FIG. 6, the lower annular part 331 is located vertically above the peripheral edge part 321 of the lower cup 32. Recesses 335 open downward are provided to be fittable to tip parts of the engaging pins 35 in regions vertically above the engaging pins 35 on the lower surface of the lower annular part 331. Further, upper magnets 37 are mounted in regions vertically above the lower magnets 36. Thus, the upper cup 33 is engageable with and disengageable from the lower cup 32 with the recesses 335 and the upper magnets 37 respectively facing the engaging pins 35 and the lower magnets 36 as shown in FIG. 6. Note that a relationship of the recesses and the engaging pins may be reversed. Further, magnets may be provided on one side and ferromagnets may be provided on the other side, besides a combination of the lower magnets 36 and the upper magnets 37.

The upper cup 33 is movable up and down along the vertical direction by the elevating mechanism 7. If the upper cup 33 is moved up by the elevating mechanism 7, a conveyance space for carrying in and out the substrate W is formed between the upper cup 33 and the lower cup 32 in the vertical direction. On the other hand, if the upper cup 33 is moved down by the elevating mechanism 7, the recesses 335 are fit to cover the tip parts of the engaging pins 35 and the upper cup 33 is positioned in a horizontal direction with respect to the lower cup 32. Further, the upper magnets 37 approach the lower magnets 36, and the positioned upper and lower cups 33, 32 are bonded to each other by attraction forces generated between the both magnets. In this way, as shown in a partial enlarged view of FIG. 3 and FIG. 8, the upper and lower cups 33, 32 are integrated in the vertical direction with a gap GPc extending in the horizontal direction formed. The rotating cup 31 is rotatable about the axis of rotation AX while forming the gap GPc.

In the rotating cup 31, as shown in FIG. 6, an outer diameter D332 of the upper annular part 332 is slightly smaller than the outer diameter D331 of the lower annular part 331 as shown in FIG. 7. Further, if diameters d331, d332 of the inner peripheral surfaces of the lower and upper annular parts 331, 332 are compared, the lower annular part 331 is larger than the upper annular part 332 and the inner peripheral surface of the upper annular part 332 is located inside the inner peripheral surface of the lower annular part 331 in a plan view vertically from above. The inner peripheral surface of the upper annular part 332 and that of the lower annular part 331 are coupled by the inclined part 333 over the entire circumference of the upper cup 33. Thus, the inner peripheral surface of the inclined part 333, i.e. a surface surrounding the substrate W, serves as an inclined surface 334. That is, as shown in FIG. 8, the inclined part 333 can collect liquid droplets scattered from the substrate W by surrounding the outer periphery of the rotating substrate W, and a space surrounded by the upper and lower cups 33, 32 functions as a collection space SPc.

Moreover, the inclined part 333 facing the collection space SPc is inclined upwardly of the peripheral edge part of the substrate W from the lower annular part 331. Thus, as shown in FIG. 8, the liquid droplets collected by the inclined part 333 can flow to a lower end part of the upper cup 33, i.e. the lower annular part 331, along the inclined surface 334, and can be discharged to the outside of the rotating cup 31 via the gap GPc.

The fixed cup 34 is provided to surround the rotating cup 31 and forms a discharge space SPe. The fixed cup 34 includes a liquid receiving part 341 and an exhaust part 342 provided inside the liquid receiving part 341. The liquid receiving part 341 has a cup structure open to face an opening (left opening of FIG. 8) of the gap GPc on a side opposite to the substrate. That is, an internal space of the liquid receiving part 341 functions as the discharge space SPe and communicates with the collection space SPc via the gap GPc. Therefore, the liquid droplets collected by the rotating cup 31 are guided into the discharge space SPe via the gap GPc together with gas components. Then, the liquid droplets are collected in a bottom part of the liquid receiving part 341 and discharged from the fixed cup 34.

On the other hand, the gas components are collected into the exhaust part 342. This exhaust part 342 is partitioned from the liquid receiving part 341 via a partition wall 343. Further, a gas guiding part 344 is arranged above the partition wall 343. The gas guiding part 344 extends from a position right above the partition wall 343 into the discharge space SPe and the exhaust part 342, thereby forming a flow passage for gas components having a labyrinth structure by covering the partition wall 343 from above. Accordingly, the gas components, out of a fluid flowing into the liquid receiving part 341, are collected in the exhaust part 342 by way of the flow passage. This exhaust part 342 is connected to an exhaust part 38. Thus, a pressure in the fixed cup 34 is adjusted by the operation of the exhaust part 38 in response to a command from the control unit 10, and the gas components in the exhaust part 342 are efficiently exhausted. Further, a pressure and a flow rate in the discharge space SPe are adjusted by a precise control of the exhaust part 38. For example, the pressure in the discharge space SPe is reduced to below that in the collection space SPc. As a result, the liquid droplets in the collection space SPc can be efficiently drawn into the discharge space SPe and movements of the liquid droplets from the collection space SPc can be promoted.

FIG. 8 is an external perspective view showing a configuration of an upper surface protecting/heating mechanism. FIG. 9 is a sectional view of the upper surface protecting/heating mechanism shown in FIG. 8. The upper surface protecting/heating mechanism 4 includes a shielding plate 41 arranged above the upper surface Wf of the substrate W held on the spin chuck 21. This shielding plate 41 includes a disk part 42 held in a horizontal posture. The disk part 42 has a built-in heater 421 drive-controlled by a heater driver 422. This disk part 42 has a diameter slightly shorter than that of the substrate W. The disk part 42 is so supported by a support member 43 that the lower surface of the disk part 42 covers a surface region excluding the peripheral edge part Ws, out of the upper surface Wf of the substrate W, from above. Note that reference sign 44 in FIG. 9 denotes a cut provided in a peripheral edge part of the disk part 42, and this cut is provided to prevent interference with processing liquid discharge nozzles included in the processing mechanism 5. The cut 44 is opened radially outward.

A lower end part of the support member 43 is mounted in a central part of the disk part 42. The cylindrical through hole is formed to vertically penetrate through the support member 43 and the disk part 42. Further, a center nozzle 45 is vertically inserted into this through hole. As shown in FIG. 2, the heated gas supplier 47 is connected to this center nozzle 45 via a pipe 46. The heated gas supplier 47 heats a nitrogen gas at a normal temperature supplied from utilities of the factory in which the substrate processing system 100 is installed and supplies the heated gas to the center nozzle 45 at a flow rate and a timing corresponding to a heated gas supply command from the control unit 10.

Herein, when the heater 471 is disposed in the internal space 12 of the chamber 11, there is a possibility that the heat radiated from the heater 471 may adversely affect the substrate processing part SP, in particular, the processing mechanism 5 and the substrate observing mechanism 9 described later. Then, in the present embodiment, the heated gas supplier 47 having the heater 471 is disposed outside the chamber 11 as shown in FIG. 4. Further, in the present embodiment, a ribbon heater 48 is mounted in a part of the pipe 46. The ribbon heater 48 generates heat in response to a heating command from the control unit 10 to heat the nitrogen gas flowing in the pipe 46.

The nitrogen gas (hereinafter, referred to as a "heated gas") heated in this way is fed under pressure toward the center nozzle 45 and discharged from the center nozzle 45. For example, as shown in FIG. 10, by supplying the heated gas with the disk part 42 positioned at a processing position near the substrate W held on the spin chuck 21, the heated gas flows toward a peripheral edge part from a central part of a space SPa sandwiched between the upper surface Wf of the substrate W and the disk part 42 including the built-in heater. In this way, an atmosphere around the substrate W can be suppressed from reaching the upper surface Wf of the substrate W. As a result, the liquid droplets included in the atmosphere can be effectively prevented from getting in the space SPa sandwiched between the substrate W and the disk part 42. Further, the upper surface Wf is entirely heated by heating of the heater 421 and the heated gas, whereby an in-plane temperature of the substrate W can be made uniform. In this way, the warping of the substrate W can be suppressed and a liquid landing position of the processing liquid can be stabilized.

As shown in FIG. 2, an upper end part of the support member 43 is fixed to a beam member 49 extending along the first virtual horizontal line VL1. This beam member 49 is connected to the elevating mechanism 7 installed on the upper surface of the base member 17 and moved up and down by the elevating mechanism 7 in response to a command from the control unit 10. For example, in FIG. 2, the beam member 49 is positioned below, whereby the disk part 42 coupled to the beam member 49 is located at the processing position via the support member 43. On the other hand, if the elevating mechanism 7 moves up the beam member 49 in response to a move-up command from the control unit 10, the beam member 49, the support member 43 and the disk part 42 integrally move upward and the upper cup 33 is also linked, separated from the lower cup 32 and moves up. In this way, the upper cup 33 and the disk part 42 are spaced wider apart from the spin chuck 21 and the substrate W can be carried to and from the spin chuck 21.

The processing mechanism 5 includes processing liquid discharge nozzles 51F (see FIG. 4) arranged on the upper surface side of the substrate W, processing liquid discharge nozzles 51B (see FIG. 2) arranged on the lower surface side of the substrate W and processing liquid suppliers 52 for supplying the processing liquid to the processing liquid discharge nozzles 51F, 51B. The lower processing liquid discharge nozzles 51F on the upper surface side and the processing liquid discharge nozzles 51B on the lower surface side are respectively referred to as "upper surface nozzles 51F" and "lower surface nozzles 51B" to be distinguished. Further, two processing liquid suppliers 52 shown in FIG. 2 are identical.

In the present embodiment, three upper surface nozzles 51F are provided, and the processing liquid supplier 52 is connected to those. Further, the processing liquid supplier 52 is configured to be capable of supplying SC1, DHF and functional water (CO2 water or the like) as the processing liquids, and the SC1, DHF and functional water can be respectively independently discharged from the three upper surface nozzles 51F.

Each of the upper surface nozzles 51F is provided with a discharge port (not shown) for discharging the processing liquid in a lower surface of a tip thereof. Then, as shown in an enlarged view in FIG. 4, with the respective discharge ports facing the peripheral edge part of the upper surface Wf of the substrate W, lower parts of a plurality of (three in the present embodiment) upper surface nozzles 51F are arranged in the cut 44 (see FIG. 6) of the disk part 42 and upper parts of the upper surface nozzles 51F are mounted movably to a nozzle holder 53 in a radial direction D1 (in a direction inclined with respect to the first virtual horizontal line VL1 with a nozzle discharge elevation angle of about 45° and a turning angle of about 65°). This nozzle holder 53 is connected to a nozzle mover 54.

FIG. 10 is a diagram schematically showing a configuration of the nozzle mover. As shown in FIG. 10, the nozzle mover 54 is attached to an upper end part of a lifter 713*a* of an elevator 713 described later while holding the nozzle head 56 (=the upper surface nozzle 51F+the nozzle holder 53). For this reason, in response to an up-and-down command from the control unit 10, the lifter 713*a* expands and contracts in the vertical direction and accordingly the nozzle mover 54 and the nozzle head 56 move in the vertical direction Z.

Further, in the nozzle mover 54, a base member 541 is fixed to the upper end part of the lifter 713*a*. To this base member 541, attached is a linear actuator 542. The linear actuator 542 has a motor (hereinafter, referred to as a "nozzle drive motor") 543 serving as a drive source of nozzle movement in the radial direction X and a motion conversion mechanism 545 for converting a rotational motion of a rotating body such as a ball screw or the like coupled to an axis of rotation of the nozzle drive motor 543 into a linear motion to thereby cause a slider 544 to reciprocally move in the radial direction D1. Further, in the motion conversion mechanism 545, in order to stabilize the movement of the slider 544 in the radial direction D1, a guide such as an LM guide (registered trademark) or the like is used.

To the slider 544 driven reciprocally in the radial direction X, a head support member 547 is coupled with a coupling member 546 interposed therebetween. This head support member 547 has a bar shape extending in the radial direction X. An end part of the head support member 547 in the (+D1) direction is fixed to the slider 544. On the other hand, an end part of the head support member 547 in the (−D1) direction is horizontally extended toward the spin chuck 21, and the nozzle head 56 is attached to a tip part thereof. For this reason, when the nozzle drive motor 543 is rotated in response to a nozzle moving command from the control unit 10, the slider 544, the head support member 547, and the nozzle head 56 are integrally moved in the (+D1) direction or the (−D1) direction in accordance with a rotation direction thereof by a distance corresponding to the amount of rotation. As a result, the upper surface nozzle 51F attached to the nozzle head 56 is positioned in the radial direction D1. As shown in FIG. 10, for example, when the upper surface nozzle 51F is positioned at a home position which is set in advance, a spring member 548 provided in the motion conversion mechanism 545 is compressed by the slider 544, to thereby give an urging force to the slider 544 in the (−X) direction. It is thereby possible to control backlash included in the motion conversion mechanism 545. Specifically, since the motion conversion mechanism 545 has mechanical components such as a guide or the like, it is practically difficult to make the backlash along the radial direction D1 zero, and the positioning accuracy of the upper surface nozzle 51F in the radial direction D1 is reduced if not sufficient consideration is made thereon. Then, in the present embodiment, by providing the spring member 548, when the upper surface nozzle 51F is immobilized at the home position, the backlash is always one-sided toward the (−D1) direction. This produces the following effects. In response to the nozzle moving command from the control unit 10, the nozzle mover 54 collectively drives the three upper surface nozzles 51F toward the direction D1. This nozzle moving command includes information on a nozzle moving distance. When the upper surface nozzle 51F is moved by the specified nozzle moving distance in the radial direction D1 on the basis of this information, the upper surface nozzle 51F is accurately positioned at a bevel processing position.

The discharge ports 511 of the upper surface nozzle 51F positioned at this bevel processing position are facing the peripheral edge part of the upper surface Wf of the substrate W. If the processing liquid supplier 52 supplies the processing liquid corresponding to a supply command, out of three kinds of processing liquids, to the upper surface nozzle 51F for the processing liquid in response to the supply command from the control unit 10, the processing liquid is discharged to the peripheral edge part of the upper surface Wf of the substrate W from the discharge port 511 of this upper surface nozzle 51F.

Further, to part of the constituent components of the nozzle mover 54, a lower sealing cup member 61 of the atmosphere separating mechanism 6 is detachably fixed. Specifically, when the bevel processing is performed, the upper surface nozzle 51F and the nozzle holder 53 are integrated with the lower sealing cup member 61 with the nozzle mover 54 interposed therebetween and moved up and down in the vertical direction Z together with the lower sealing cup member 61 by the elevating mechanism 7. On the other hand, when calibration processing is performed, the lower sealing cup member 61 is detached, and the upper surface nozzle 51F and the nozzle holder 53 are reciprocally moved in the radial direction D1 by the nozzle mover 54 and also moved up and down in the vertical direction Z by the elevating mechanism 7.

Figure 13:
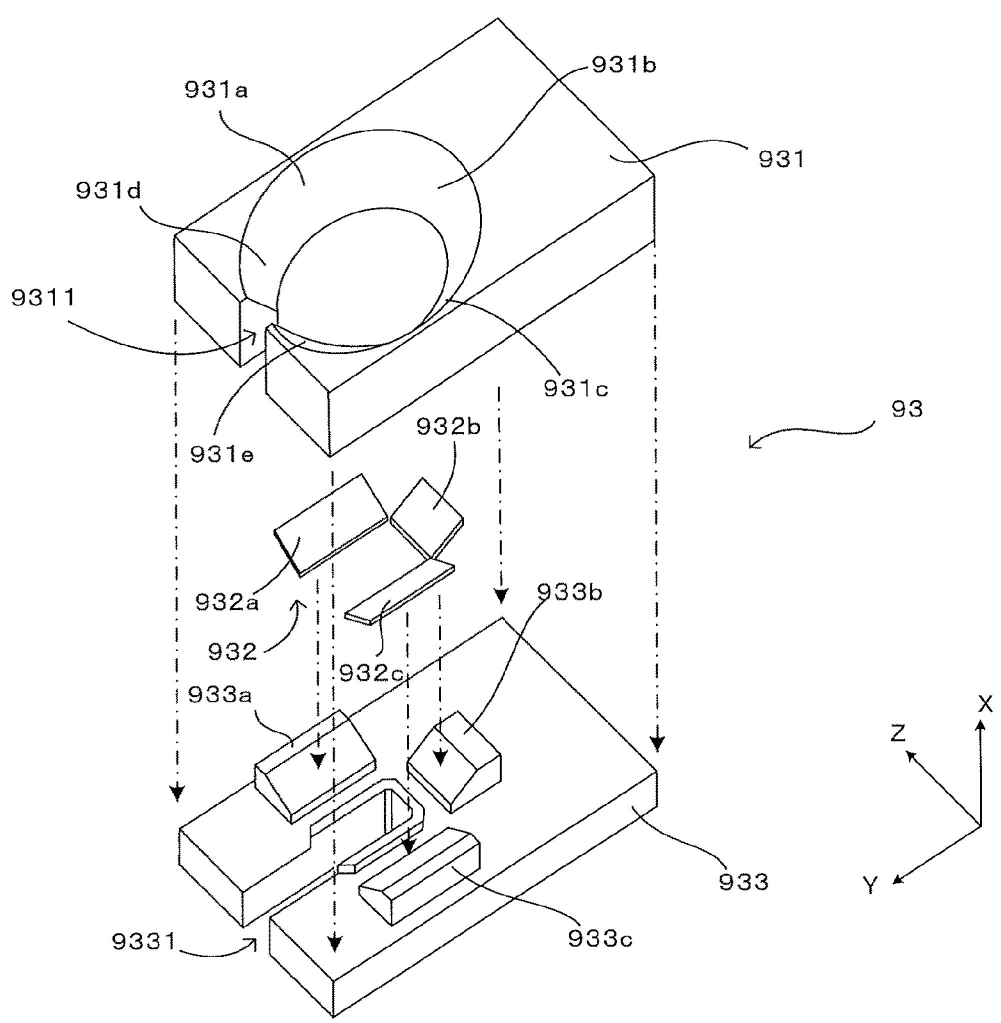
FIG. 13 is an exploded assembly perspective view of the observation head shown in FIG. 12.

In the present embodiment, the lower surface nozzles 51B and a nozzle support 57 are provided below the substrate W held on the spin chuck 21 to discharge the processing liquid toward the peripheral edge part of the lower surface Wb of the substrate W. As shown in FIG. 13, the nozzle support 57 includes a thin hollow cylindrical part 571 extending in the vertical direction and a flange part 572 having an annular shape and bent to expand radially outward in an upper end part of the hollow cylindrical part 571. The hollow cylindrical part 571 is shaped to be loosely insertable into the air gap GPa formed between the annular member 27*a* and the lower cup 32. As shown in FIG. 2, the nozzle support 57 is so fixedly arranged that the hollow cylindrical part 571 is loosely inserted in the air gap GPa and the flange part 572 is located between the substrate W supported on the spin chuck 21 and the lower cup 32. Three lower surface nozzles 51B are mounted on a peripheral edge part of the upper surface of the flange part 572. Each lower surface nozzle 51B includes a discharge port (not shown) open toward the peripheral edge part of the lower surface Wb of the substrate W and can discharge the processing liquid supplied from the processing liquid supplier 52 via a pipe 58.

The bevel processing for the peripheral edge part of the substrate W is performed by the processing liquids discharged from these upper surface nozzles 51F and lower surface nozzles 51B. Further, on the lower surface side of the substrate W, the flange part 572 is extended to the vicinity of the peripheral edge part Ws. Thus, the nitrogen gas supplied to the lower surface side via the pipe 28 flows into the collection space SPc along the flange part 572 as shown in FIG. 8. As a result, a backflow of the liquid droplets from the collection space SPc to the substrate W is effectively suppressed.

The atmosphere separating mechanism 6 includes the lower sealing cup member 61 and an upper sealing cup member 62. Both of the upper and lower sealing cup members 61, 62 have a tube shape open in the vertical direction. Inner diameters of those are larger than an outer diameter of the rotating cup 31, and the atmosphere separating mechanism 6 is arranged to completely surround the spin chuck 21, the substrate W held on the spin chuck 21, the rotating cup 31 and the upper surface protecting/heating mechanism 4 from above. More particularly, as shown in FIG. 2, the upper sealing cup member 62 is fixedly arranged at a position right below the punching plate 14 such that the upper opening thereof covers the opening 11*f*1 of the ceiling wall 11*f* from below. Thus, a downflow of clean air introduced into the chamber 11 is separated into a flow passing through the inside of the upper sealing cup member 62 and a flow passing outside the upper sealing cup member 62.

Further, a lower end part of the upper sealing cup member 62 includes a flange part 621 bent inwardly and having an annular shape. An O-ring 63 is mounted on the upper surface of this flange part 611. The lower sealing cup member 61 is arranged movably in the vertical direction inside the upper sealing cup member 62.

Figure 14:
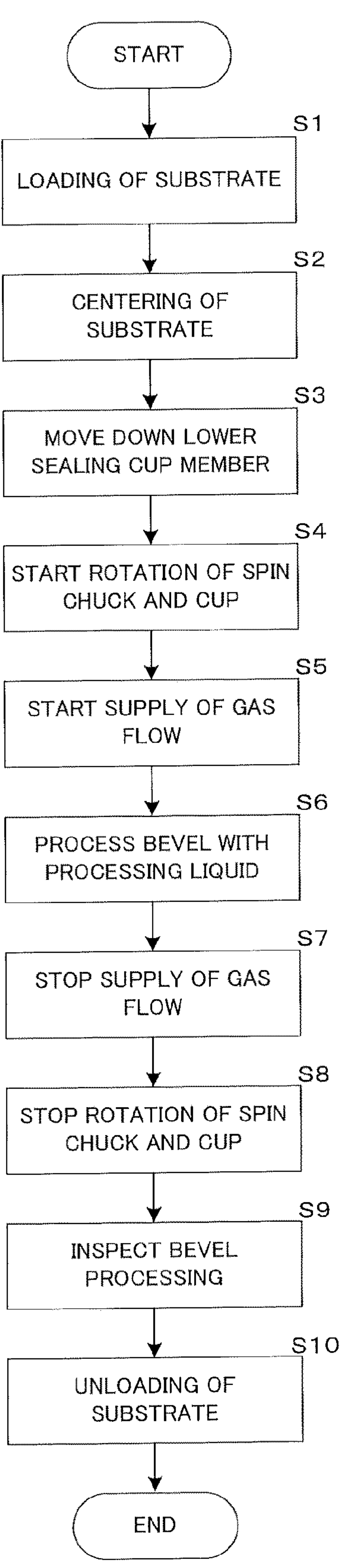
FIG. 14 is a flow chart showing bevel processing performed, as an example of a substrate processing operation, by the substrate processing apparatus shown in FIG. 2.

An upper end part of the lower sealing cup member 61 includes a flange part 611 bent to expand outward and having an annular shape. The flange part 611 overlaps the flange part 621 in a plan view vertically from above. Thus, if the lower sealing cup member 61 moves down, as shown in the partial enlarged view of FIG. 4, the flange part 611 of the lower sealing cup member 61 is locked by the flange part 621 of the upper sealing cup member 62 via the O-ring 63 as shown in FIGS. 3 and 14. In this way, the lower sealing cup member 61 is positioned at a lower limit position. At this lower limit position, the upper and lower sealing cup members 62, 61 are connected in the vertical direction, and a downflow introducing into the upper sealing cup member 62 is guided toward the substrate W held on the spin chuck 21.

A lower end part of the lower sealing cup member 61 includes a flange part 612 bent outwardly and having an annular shape. This flange part 612 overlaps an upper end part of the fixed cup 34 (upper end part of the liquid receiving part 341) in a plan view vertically from above. Thus, at the lower limit position, the flange part 612 of the lower sealing cup member 61 is locked by the fixed cup 34 via an O-ring 64 as shown in the enlarged view of FIG. 3 and FIG. 14. In this way, the lower sealing cup member 61 and the fixed cup 34 are connected in the vertical direction, and a sealed space 12*a* is formed by the upper sealing cup member 62, the lower sealing cup member 61 and the fixed cup 34. The bevel processing on the substrate W can be performed in this sealed space SPs. That is, by positioning the lower sealing cup member 61 at the lower limit position, the sealed space 12*a* is separated from an outside space 12*b* of the sealed space 12*a* (atmosphere separation). Therefore, the bevel processing can be stably performed without being influenced by an outside atmosphere. Further, the processing liquids are used to perform the bevel processing. The processing liquids can be reliably prevented from leaking from the sealed space 12*a* to the outside space 12*b*. Thus, a degree of freedom in selecting/designing components to be arranged in the outside space 12*b* is enhanced.

The lower sealing cup member 61 is also configured to be movable vertically upward. The nozzle head 56 (=upper surface nozzles 51F+nozzle holder 53) is fixed to an intermediate part of the lower sealing cup member 61 in the vertical direction via the the head support member 547 of the support member 54 as described above. Besides this, as shown in FIGS. 2 and 3, the upper surface protecting/heating mechanism 4 is fixed to an intermediate part of the lower sealing cup member 61 via the beam member 49. That is, as shown in FIG. 4, the lower sealing cup member 61 is connected to one end part of the beam member 49, the other end part of the beam member 49 and the head support member 547 of the support member 54 at three positions mutually different in the circumferential direction. By moving up and down the one end part of the beam member 49, the other end part of the beam member 49 and the support member 54 by the elevating mechanism 7, the lower sealing cup member 61 is also moved up and down accordingly.

As shown in FIGS. 2 and 4, a plurality of (four) projections 613 are provided to project inward as engaging parts engageable with the upper cup 33 on the inner peripheral surface of the lower sealing cup member 61. Each projection 613 extends to a space below the upper annular part 332 of the upper cup 33. Further, each projection 613 is so mounted to be separated downward from the upper annular part 332 of the upper cup 33 with the lower sealing cup member 61 positioned at the lower limit position. By an upward movement of the lower sealing cup member 61, each projection 613 is engageable with the upper annular part 332 from below. The lower sealing cup member 61 moves further upward also after this engagement, whereby the upper cup 33 can be separated from the lower cup 32.

In the present embodiment, after the lower sealing cup member 61 starts to be moved up together with the upper surface protecting/heating mechanism 4 and the nozzle head 56 by the elevating mechanism 7, the upper cup 33 also moves up. In this way, the upper cup 33, the upper surface protecting/heating mechanism 4 and the nozzle head 56 are separated upward from the spin chuck 21. By a movement of the lower sealing cup member 61 to a retracted position, the conveyance space for allowing the hand (RH in FIG. 16A) of the substrate conveyor robot 111 to access the spin chuck 21 is formed. The substrate W can be loaded onto the spin chuck 21 and unloaded from the spin chuck 21 via this conveyance space. As just described, in the present embodiment, the substrate W can access the spin chuck 21 by a minimum upward movement of the lower sealing cup member 61 by the elevating mechanism 7.

The elevating mechanism 7 includes two elevation drivers 71, 72. In the elevation driver 71, a first elevation motor (not shown) is attached to a first elevation mounting portion 173 (FIG. 3) of the base member 17. The first elevation motor generates a rotational force by operating in response to a drive command from the control unit 10. Two elevators 712, 713 are coupled to this first elevation motor 711. The elevators 712, 713 simultaneously receive the rotational force from the first elevation motor 711. Then, the elevator 712 moves up and down a support member 491 supporting the one end part of the beam member 49 along the vertical direction Z according to a rotation amount of the first elevation motor 711. Further, the elevator 713 moves up and down the support member 54 supporting the nozzle head 56 along the vertical direction Z according to the rotation amount of the first elevation motor 711.

In the elevation driver 72, a second elevation motor (not shown) is attached to a second elevation mounting portion 174 (FIG. 3) of the base member 17. An elevator 722 is coupled with the second elevation motor. The second elevation motor generates a rotational force by operating in response to a drive command from the control unit 10 and gives the generated rotational force to the elevator 722. The elevator 722 moves up and down a support member 492 supporting the other end part of the beam member 49 along the vertical direction according to the amount of rotation of the second elevation motor.

The elevation drivers 71, 72 synchronously and vertically move the support members 491, 492 and 54 respectively fixed to the side surface of the lower sealing cup member 61 at three positions mutually different in the circumferential direction. Therefore, the upper surface protecting/heating mechanism 4, the nozzle head 56 and the lower sealing cup member 61 can be stably moved up and down. Further, the upper cup 33 can be also stably moved up and down as the lower sealing cup member 61 is moved up and down.

FIG. 11 is a diagram schematically showing the configuration and operation of the centering mechanism. The centering mechanism 8 performs centering processing while the suction by the pump 26 is stopped (i.e. while the substrate W is horizontally movable on the upper surface of the spin chuck 21). By this centering processing, the eccentricity of the substrate W (with respect to the spin chuck 21) is eliminated and a center of the substrate W coincides with the axis of rotation AX. As shown in FIGS. 4 and 11, the centering mechanism 8 has a single contact part 81 disposed on a side of the conveyance opening 11*b*1 (on the right side of FIG. 11) with respect to the axis of rotation AX in a contact movement direction D2 inclined at about 40° with respect to the first virtual horizontal line VL1, a multi-contact part 82 disposed on a side of the maintenance opening 11*d*1 (on the left side of FIG. 11), and a centering driver 83 for moving the single contact part 81 and the multi-contact part 82 in the contact movement direction D2.

The single contact part 81 has a shape extending in parallel to the contact movement direction D2 and is finished to be contactable with the end surface of the substrate W on the spin chuck 21 at a tip part on the side of the spin chuck 21. On the other hand, the multi-contact part 82 has a substantial Y shape in a plan view vertically from above and is finished to be contactable with the end surface of the substrate W on the spin chuck 21 at each tip part of a bifurcated portion on the side of the spin chuck 21. The single contact part 81 and the multi-contact part 82 are movable in the contact movement direction D2.

The centering driver 83 has a single mover 831 for moving the single contact part 81 in the contact movement direction D2 and a multi-mover 832 for moving the multi-contact part 82 in the contact movement direction D2. The single mover 831 is mounted on a single moving attachment portion 175 (FIG. 3) of the base member 17 and the multi-mover 832 is mounted on a multi-moving attachment portion 176 (FIG. 3) of the base member 17. While the centering processing of the substrate W is not performed, as shown in FIG. 4 and the column (a) of FIG. 11, the centering driver 83 positions the single contact part 81 and the multi-contact part 82 away from the spin chuck 21. For this reason, the single contact part 81 and the multi-contact part 82 are away from the conveyance path TP, and it is thereby possible to effectively prevent interference of the single contact part 81 and the multi-contact part 82 with the substrate W loaded into or unloaded from the chamber 11.

On the other hand, when the centering processing of the substrate W is performed, in response to a centering command from the control unit 10, the single mover 831 move the single contact part 81 toward the axis of rotation AX and the multi-mover 832 moves the multi-contact part 82 toward the axis of rotation AX. The center of the substrate W thereby coincides with the axis of rotation AX, as shown in the column (b) of FIG. 11.

Figure 12:
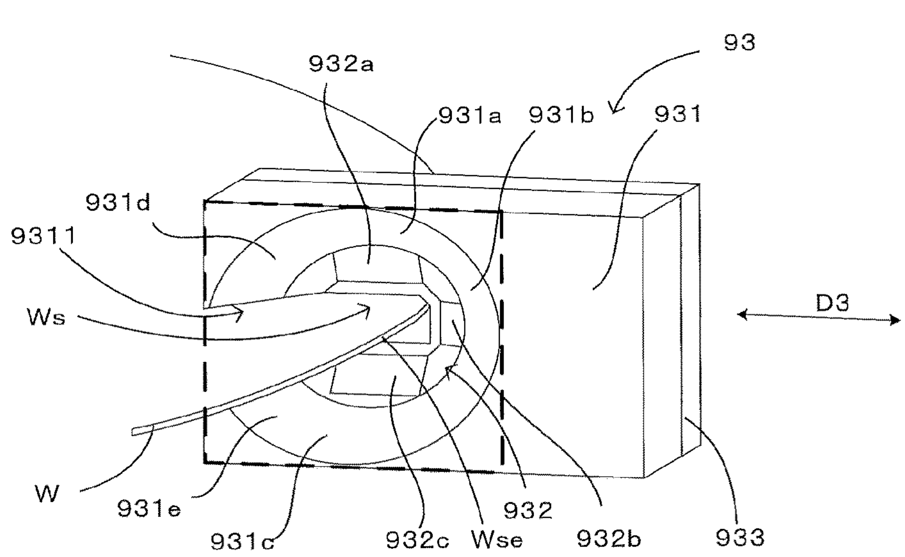
FIG. 12 is a perspective view showing an observation head of a substrate observing mechanism.

FIG. 12 is a perspective view showing an observation head of the substrate observing mechanism. FIG. 13 is an exploded assembly perspective view of the observation head shown in FIG. 12. The substrate observing mechanism 9 has a light source part 91, an image pickup part 92, an observation head 93, and an observation head driver 94. The light source part 91 and the image pickup part 92 are arranged in parallel at an optical component attachment position 177 (FIG. 3) of the base member 17. In response to a lighting command from the control unit 10, the light source part 91 emits illumination light toward an observation position. This observation position is a position corresponding to the peripheral edge part Ws of the substrate W, which corresponds to a position at which the observation head 93 is positioned in FIG. 12.

The observation head 93 is reciprocally movable between the observation position and a separation position away from the observation position outside in a radial direction of the substrate W. The observation head driver 94 is connected to the observation head 93. The observation head driver 94 is attached to the base member 17 at a head driving position 178 (FIG. 3) of the base member 17. In response to a head moving command from the control unit 10, the observation head driver 94 causes the observation head 93 to reciprocally move in a head movement direction D3 inclined at about 10° with respect to the first virtual horizontal line VL1. More specifically, while observation processing of the substrate W is not performed, the observation head driver 94 causes the observation head 93 to move to the retracted position, to be positioned. For this reason, the observation head 93 is away from the conveyance path TP, and it is thereby possible to effectively prevent interference of the observation head 93 with the substrate W loaded into or unloaded from the chamber 11. On the other hand, when the observation processing of the substrate W is performed, in response to a substrate observing command from the control unit 10, the observation head driver 94 causes the observation head 93 to move to the observation position.

As shown in FIGS. 12 and 13, the observation head 93 has a diffused lighting part 931 having five diffusion surfaces 931*a* to 931*e*, a guide 932 consisting of three mirror members 932*a* to 932*c*, and a holder 933.

The holder 933 is composed of, for example, PEEK (polyetheretherketone), and as shown in FIGS. 12 and 13, is provided with a cut 9331 at an end part on a side of the substrate W. The size of the cut 9331 in the vertical direction is wider than the thickness of the substrate W, and as shown in FIG. 12, when the observation head 93 is positioned at the observation position, the cut 9331 enters the peripheral edge part Ws of the substrate W and even an area inside in the radial direction from the peripheral edge part Ws. Further, the holder 933 is finished to have a shape which can be engaged with the diffused lighting part 931. Moreover, the holder 933 has mirror supporters 933*a* to 933*c* for supporting the mirror members 932*a* to 932*c* from a back-surface side, respectively. For this reason, the diffused lighting part 931 and the holder 933 are engaged with each other, to be thereby integrated while holding the mirror members 932*a* to 932*c*.

The diffused lighting part 931 is composed of, for example, PTFE (polytetrafluoroethylene). As shown in FIGS. 12 and 13, the diffused lighting part 931 has a plate shape extending in the horizontal direction and is provided with a cut 9311 at an end part on a side of the substrate W, like the holder 933. As shown in FIG. 12, the cut 9311 has an inverted C shape viewed from a circumferential direction of the substrate W. Further, in the diffused lighting part 931, an inclined surface is provided along the cut 9311. The inclined surface is a tapered surface which is finished to be inclined toward a direction (horizontal direction orthogonal to the direction D3) in which the illumination light goes as it gets closer to the cut 9311. Especially, a vertical upper area of the cut 9311, a side area thereof, and a vertical lower area thereof in this tapered surface serve as the diffusion surfaces 931*a* to 931*c*, respectively. Further, in the cut 9311, areas positioned on a side of axis of rotation AX of the mirror members 932*a* and 932*c* serve as the diffusion surfaces 931*d* and 931*e*, respectively.

When the observation head 93 having such a configuration is positioned at the observation position, the diffusion surfaces 931*a* to 931*e* are positioned in a lighting area (indicated by a thick broken-line area in FIG. 12) formed by the light source part 91. When the light source part 91 is lighted in response to the lighting command from the control unit 10 in this positioning state, the illumination light is emitted to the lighting area. At that time, the diffusion surfaces 931*a* to 931*e* diffusedly reflect the illumination light and illuminate the peripheral edge part Ws of the substrate W and an adjacent area thereof from various directions. Herein, among the illumination light, part of upper-surface diffused light that goes toward the upper surface of the substrate W including the peripheral edge part Ws is reflected by the upper surface of the peripheral edge part Ws and the adjacent area of the peripheral edge part Ws (an upper-surface area adjacent to the peripheral edge part Ws inside in the radial direction). This reflected light is reflected by a reflection surface of the mirror member 932*a* and then guided to the image pickup part 92. Further, among the illumination light, part of lower-surface diffused light that goes toward the lower surface of the substrate W including the peripheral edge part Ws is reflected by the lower surface of the peripheral edge part Ws and the adjacent area of the peripheral edge part Ws (a lower-surface area adjacent to the peripheral edge part Ws inside in the radial direction). This reflected light is reflected by a reflection surface of the mirror member 932*c* and then guided to the image pickup part 92. Among the illumination light, part of side-surface diffused light that goes toward the side surface (end surface) Wse of the substrate W is reflected by the side surface Wse of the substrate W. This reflected light is reflected by a reflection surface of the mirror member 932*b* and then guided to the image pickup part 92.

The image pickup part 92 has an observation lens system consisting of object-side telecentric lenses and a CMOS camera. Therefore, among the reflected light guided from the observation head 93, only rays of light in parallel to the optical axis of the observation lens system enter a sensor surface of the CMOS camera and an image of the peripheral edge part Ws of the substrate W and the adjacent area thereof is formed on the sensor surface. Thus, the image pickup part 92 images the peripheral edge part Ws of the substrate W and the adjacent area thereof and acquires an upper-surface image, a side-surface image, and a lower-surface image of the substrate W. Then, the image pickup part 92 transmits image data representing these images to the control unit 10.

The control unit 10 includes an arithmetic processor 10A, a storage 10B, a reader 10C, an image processor 10D, a drive controller 10E, a communicator 10F and an exhaust controller 10G. The storage 10B is constituted by a hard disk drive or the like, and stores a program for performing the bevel processing by the substrate processing apparatus 1. This program is stored, for example, in a computer-readable recording medium RM (e.g. an optical disk, a magnetic disk, a magneto-optical disk, or the like), read from the recording medium RM by the reader 10C and saved in the storage 10B. Further, the program may be provided, for example, via an electrical communication line without being limited to provision via the recording medium RM. The image processor 10D applies various processings to an image captured by the substrate observing mechanism 9. The drive controller 10E controls each driver of the substrate processing apparatus 1. The communicator 10F conducts communication with a controller for integrally controlling each component of the substrate processing system 100 and the like. The exhaust controller 10G controls the exhaust part 38.

Further, a display unit 10H (e.g. a display and the like) for displaying various pieces of information and an input unit (e.g. a keyboard, a mouse and the like) for receiving an input from an operator are connected to the control unit 10.

The arithmetic processor 10A is constituted by a computer including a CPU (=Central Processing Unit), a RAM (=Random Access Memory) and the like, and performs the bevel processing by controlling each component of the substrate processing apparatus 1 in accordance with the program stored in the storage 10B as described below. The bevel processing by the substrate processing apparatus 1 is described below with reference to FIG. 14.

FIG. 14 is a flowchart showing bevel processing performed, as an example of a substrate processing operation, by the substrate processing apparatus shown in FIG. 2. In applying the bevel processing to the substrate W by the substrate processing apparatus 1, the arithmetic processor 10A causes the elevation drivers 71, 72 to integrally move up the lower sealing cup member 61, the nozzle head 56, the beam member 49, the support member 43 and the disk part 42. While the lower sealing cup member 61 is moving up, the projections 613 are engaged with the upper annular part 332 of the upper cup 33 and, thereafter, the upper cup 33 is moved up together with the lower sealing cup member 61, the nozzle head 56, the beam member 49, the support member 43 and the disk part 42 and positioned at the retracted position. In this way, the conveyance space sufficient to allow the entrance of the hand (not shown) of the substrate conveyor robot 111 is formed above the spin chuck 21. Further, the arithmetic processor 10A uses the centering driver 83 to move the single mover 831 and the multi-contact part 82 to the retracted position away from the spin chuck 21 and also uses the observation head driver 94 to move the observation head 93 to a waiting position away from the spin chuck 21. Among the constituent elements arranged around the spin chuck 21, as shown in FIG. 4, the nozzle head 56, the light source part 91, the image pickup part 92, the motor 23, and the multi-contact part 82 are thereby positioned on the side of the maintenance opening (the lower side in this figure) relative to the first virtual horizontal line VL1. Further, though the single mover 831 and the observation head 93 are positioned on the side of the conveyance opening 11*b*1 relative to the first virtual horizontal line VL1, these constituent elements are out of a moving area of the substrate W along the conveyance path TP. In the present embodiment, since such a layout structure is adopted, in loading of the substrate W into or out from the chamber 11, it is possible to effectively prevent interference of the constituent elements arranged around the spin chuck 21 with the substrate W.

After confirming the completion of the formation of the conveyance space and the prevention of interference with the substrate W, the arithmetic processor 10A gives a loading request of the substrate W to the substrate conveyor robot 111 via the communicator 10F and it is waited until an unprocessed substrate W is carried into the substrate processing apparatus 1 along the conveyance path TP shown in FIG. 4 and placed on the upper surface of the spin chuck 21. Then, the substrate W is placed on the spin chuck 21 (Step S1). Note that, at this point of time, the pump 26 is stopped and the substrate W is horizontally movable on the upper surface of the spin chuck 21.

If the loading of the substrate W is completed, the substrate conveyor robot 111 is retracted along the conveyance path TP from the substrate processing apparatus 1. Following that, the arithmetic processor 10A controls the centering driver 83 such that the single contact part 81 and the multi-contact part 82 approach the substrate W. In this way, the eccentricity of the substrate W with respect to the spin chuck 21 is eliminated and the center of the substrate W coincides with that of the spin chuck 21 (Step S2). If the centering processing is completed in this way, the arithmetic processor 10A controls the centering driver 82 to separate the three contact members 81 from the substrate W and operates the pump 26 to apply a negative pressure to the spin chuck 21. In this way, the spin chuck 21 sucks and holds the substrate W from below.

Subsequently, the arithmetic processor 10A gives a move-down command to the elevation drivers 71, 72. In response to this, the elevation drivers 71, 72 integrally move down the lower sealing cup member 61, the nozzle head 56, the beam member 49, the support member 43 and the disk part 42. During these downward movements, the upper cup 33 supported from below by the projections 613 of the lower sealing cup member 61 is coupled to the lower cup 32. That is, the recesses 335 are fit to cover the tip parts of the engaging pins 35 as shown in FIG. 6, the upper cup 33 is positioned in the horizontal direction with respect to the lower cup 32 and the upper and lower cups 33, 32 are bonded to each other to form the rotating cup 31 by attraction forces generated between the upper and lower magnets 37, 36.

After the rotating cup 31 is formed, the lower sealing cup member 61, the nozzle head 56, the beam member 49, the support member 43 and the disk part 42 are further integrally moved down, and the flange parts 611, 612 of the lower sealing cup member 61 are respectively locked by the flange part 621 of the upper sealing cup member 62 and the fixed cup 34. In this way, the lower sealing cup member 61 is positioned at the lower limit position (position in FIGS. 2 and 16C) (Step S3). After the above locking, the flange part 621 of the upper sealing cup member 62 and the flange part 611 of the lower sealing cup member 61 are held in close contact via the O-ring 63, and the flange part 612 of the lower sealing cup member 61 and the fixed cup 34 are held in close contact via the O-ring 63. As a result, as shown in FIG. 2, the lower sealing cup member 61 and the fixed cup 34 are connected in the vertical direction, and the sealed space SPs is formed by the upper sealing cup member 62, the lower sealing cup member 61 and the fixed cup 34, and the sealed space SPs is separated from the outside atmosphere (outside space SPo) (atmosphere separation).

In this atmosphere separated state, the lower surface of the disk part 42 covers the surface region excluding the peripheral edge part Ws, out of the upper surface Wf of the substrate W, from above. Further, the upper surface nozzles 51F are positioned in such a posture that the discharge ports 511 are facing the peripheral edge part of the upper surface Wf of the substrate W in the cut 44 of the disk part 42. If preparation for the supply of the processing liquids to the substrate W is completed in this way, the arithmetic processor 10A gives a rotation command to the rotation driver 23 to start the rotation of the spin chuck 21 holding the substrate W and the rotating cup 31 (Step S4). Rotating speeds of the substrate W and the rotating cup 31 are set, for example, at 1800 rpm. Further, the arithmetic processor 10A controls the drive of the heater driver 422 to heat the heater 421 to a desired temperature, e.g. 185° C.

Next, the arithmetic processor 10A gives the heated gas supply command to the heated gas supplier 47. The nitrogen gas heated by the heater 471, i.e., the heated gas is thereby fed under pressure from the heated gas supplier 47 toward the center nozzle 45 (Step S5). This heated gas is heated by the ribbon heater 48 during passing through the pipe 46. This heated gas is thereby discharged from the center nozzle 45 toward the space SPa (FIG. 9) sandwiched between the substrate W and the disk part 42 while a decrease in the temperature is prevented during the gas supply through the pipe 46. The entire upper surface Wf of the substrate W is thereby heated. Further, the substrate W is also heated by the heater 421. For this reason, the temperature of the peripheral edge part Ws of the substrate W rises with the passage of time and reaches a temperature suitable for the bevel processing, e.g. 90° C. Further, the temperature of the substrate W other than the peripheral edge part Ws also rises to a substantially equal temperature. In other words, in the present embodiment, the in-plane temperature of the upper surface Wf of the substrate W is substantially uniform. Therefore, the warping of the substrate W can be effectively suppressed.

Following this, the arithmetic processor 10A supplies the processing liquids to the upper surface nozzles 51F and the lower surface nozzles 51B by controlling the processing liquid suppliers 52 (arrows F2, F3 in FIG. 16C). That is, flows of the processing liquids are discharged from the upper surface nozzles 51F to contact the peripheral edge part of the upper surface of the substrate W, and flows of the processing liquids are discharged from the lower surface nozzles 51B to contact the peripheral edge part of the lower surface of the substrate W. In this way, the bevel processing is performed on the peripheral edge part Ws of the substrate W (Step S6). Upon detecting the passage of a processing time required for the bevel processing of the substrate W, the arithmetic processor 10A gives a supply stop command to the processing liquid suppliers 52 to stop the discharge of the processing liquids.

Following that, the arithmetic processor 10A gives a supply stop command to the nitrogen gas supplier 47 to stop the supply of the nitrogen gas from the nitrogen gas supplier 47 to the center nozzle 45 (Step S7). Further, the arithmetic processor 10A gives a rotation stop command to the rotation driver 23 to stop the rotation of the spin chuck 21 and the rotating cup 31 (Step S8).

In next Step S9, the arithmetic processor 10A observes the peripheral edge part Ws of the substrate W to inspect a result of the bevel processing. More specifically, the arithmetic processor 10A positions the upper cup 33 at the retracted position to form the conveyance space in the same manner as that during the loading of the substrate W. Then, the arithmetic processor 10A controls the observation head driver 94 to bring the observation head 93 closer to the substrate W. Then, the arithmetic processor 10A lights the light source part 91 to illuminate the peripheral edge part Ws of the substrate W through the observation head 93. Further, the image pickup part 92 receives the reflected light which is reflected by the peripheral edge part Ws and the adjacent area, to thereby image the peripheral edge part Ws and the adjacent area. Specifically, a peripheral-edge-part image of the peripheral edge part Ws along the rotation direction of the substrate W is acquired out of a plurality of images of the peripheral edge part Ws acquired by the image pickup part 92 while the substrate W is rotated about the axis of rotation AX. Then, the arithmetic processor 10A controls the observation head driver 94 to retract the observation head 93 from the substrate W. In parallel with this, the arithmetic processor 10A inspects whether or not the bevel processing has been satisfactorily performed, on the basis of the picked-up image of the peripheral edge part Ws and the adjacent area, i.e., the peripheral-edge-part image. Further, in the present embodiment, as an example of the inspection, a processing width is inspected from the peripheral-edge-part image, which is processed by using the processing liquids, from the end surface of the substrate W toward the central part of the substrate W (inspection after processing).

After the inspection, the arithmetic processor 10A gives an unloading request of the substrate W to the substrate conveyor robot 111 via the communicator 10F, and the processed substrate W is unloaded from the substrate processing apparatus 1 (Step S10). Further, this series of steps is repeatedly performed.

In the above-described embodiment, the motor attachment portion 171 and the spin chuck attachment portion 172 respectively correspond to examples of the "first holding portion" and the "second holding portion" of the present invention.

As described above, in this embodiment, the following effects can be obtained because the respective parts of the apparatus are arranged as described above.

(A) In the conventional substrate processing apparatus, since the substrate processing is performed by accessing the substrate W held by the spin chuck 21 serving as the substrate holder, it is general to dispose the spin chuck 21 at the center 11*g* of the chamber 11 or in the vicinity thereof. In contrast to this, in the present embodiment, as shown in FIG. 4, the substrate holder 2A is arranged at the processing position which is offset toward the side of the conveyance opening 11*b*1 relative to the center 11*g* of the internal space 12 in the internal space 12 of the chamber 11. The conveyance distance and the conveyance time of the substrate W along the conveyance path TP are shortened by this offset (distance Lof), and power saving can be achieved.

(B) Even without expanding the internal space 12 of the chamber 11, the area on the opposite side of the conveyance opening in the spin chuck 21, i.e., the area on the opposite side of the conveyance opening 11*b*1 with respect to the first virtual horizontal line VL1 is expanded, and the degree of design freedom on the arrangement of the processing mechanism 5 increases. As shown in FIG. 10, however, in the substrate processing apparatus configured to cause the nozzle mover 54 to move the processing liquid discharge nozzle 51B in the radial direction D1 of the substrate W, the nozzle mover 54 needs a stroke to some degree in the movement direction of the processing liquid discharge nozzle 51B. Therefore, when the movement direction of the processing liquid discharge nozzle 51B is set to the same direction as that of the conveyance path TP, for example, there is a possibility that the processing mechanism, particularly the nozzle mover 54 cannot be housed in the internal space 12 though the area on the opposite side of the conveyance opening is expanded. In the present embodiment, however, as described above, the nozzle mover 54 is configured to move the processing liquid discharge nozzle 51F in the radial direction D1 inclined with respect to the first virtual horizontal line VL1 among the radial direction of the substrate W. The arrangement relation of the spin chuck 21, the nozzle head, and the nozzle mover 54 inside the chamber 11 is thereby optimized, and it is possible to satisfactorily perform the bevel processing without using the chamber 11 having the internal space 12 that is unnecessarily large. As a result, it is possible to suppress the amount of gas to be exhausted in the internal space 12 by the exhaust part 38 and further possible to ensure reduction in the environmental load and the power consumption.

(C) In the above-described embodiment, as shown in FIGS. 3 and 4, the heater 471 for obtaining the heated gas to heat the substrate W is attached to the outer wall (sidewall 11*e*) of the chamber 11. In other words, the heater 471 is provided outside the chamber 11. Therefore, it is possible to prevent the heat generated by the heater 471 from affecting various mechanisms disposed in the internal space 12 of the chamber 11. Especially, since the light source part 91 and the image pickup part 92 are susceptible to the effect of heat, in the present embodiment, the light source part 91 and the image pickup part 92 are arranged at the separation position away from the attachment portion of the heater 471. Therefore, by adopting the above-described layout structure, the light source part 91 and the image pickup part 92 become less susceptible to the effect of heat generated by the heater 471. As a result, it is possible to prevent the reduction in the observation accuracy due to the effect of temperature change and further possible to observe the peripheral edge part of the substrate with high accuracy. Further, regarding the effect of heat from the heater 471, since the processing liquid discharge nozzles 51F and 51B are also susceptible thereto, the processing liquid discharge nozzles 51F and 51B are arranged at the separation position away from the attachment portion of the heater 471. In more detail, as shown in FIG. 4, the light source part 91, the image pickup part 92, and the processing liquid discharge nozzles 51F and 51B are arranged on the opposite side of the heater 471 with respect to the second virtual horizontal line VL2 in a plan view of the chamber 11 viewed from above. By adopting such an arrangement structure, the respective distances from the heater 471 to the light source part 91, the image pickup part 92, and the processing liquid discharge nozzles 51F and 51B are increased, and it is possible to reliably suppress the effect of heat from the heater 471.

(D) Though less than the heat from the heater 471, the heat is also radiated from the pipe 46 for feeding the heated gas (inert gas heated by the heater 471) to the center nozzle 45 and the ribbon heater 48 disposed around the pipe 46. Then, in the present embodiment, the pipe 46 and the ribbon heater 48 are arranged on the opposite side of the constituent components (the light source part 91, the image pickup part 92, and the processing liquid discharge nozzles 51F and 51B) susceptible to the effect of heat from the heater 471 with respect to the second virtual horizontal line VL2 and on the opposite side of the conveyance opening 11*b*1 with respect to the first virtual horizontal line VL1 in a plan view of the chamber 11 viewed from above. For this reason, the effect of heat radiated from the pipe 46 or the like is suppressed from being produced on the above-described constituent components.

(E) In the above-described embodiment, the two pulleys 241 and 242 and the endless belt 243 constitute the power transmitter 24, and the substrate holder 2A and the motor 23 are coupled to each other by the power transmitter 24. For this reason, the power transmitter 24 transmits the driving force generated by the motor to the substrate holder 2A. Therefore, when some troubles occur in the motor 23 and the power transmitter 24, such as elongation, breakage, and/or the like of the endless belt 243, with the operation of the substrate processing apparatus 1, a maintenance work is needed as appropriate, such as adjustment of the power transmitter 24, exchange of the components constituting the power transmitter 24, and/or the like. In such a case, the operator can expose the power transmitter 24 and the motor 23 to the outside through the maintenance opening 11*d*1 by detaching the lid member 19 from the chamber 11 to open the maintenance opening 11*d*1. Then, the operator can perform the maintenance work through the maintenance opening 11*d*1. As a result, it is possible to increase the efficiency of the maintenance work.

(F) Since the substrate holder 2A is arranged at the processing position which is offset toward the side of the conveyance opening relative to the center 11*g* of the internal space 12, the area on the opposite side of the conveyance opening 11*b*1 with respect to the first virtual horizontal line VL1, i.e., the area facing the maintenance opening 11*d*1 is expanded. For this reason, it becomes easier to perform the maintenance work through the maintenance opening 11*d*1, as compared with the case without the offset. In this point, the same applies to the maintenance work on the light source part 91 and the image pickup part 92 described next.

(G) As shown in FIG. 4, the light source part 91 and the image pickup part 92 in the substrate observing mechanism 9 are also so arranged as to face the maintenance opening 11*d*1. For this reason, the operator can also access the light source part 91 and the image pickup part 92 through the maintenance opening 11*d*1. Therefore, it also becomes easier to perform the maintenance work on the light source part 91 and the image pickup part 92.

(H) As shown in FIG. 5, the motor 23 is held by the base member 17, being hung from the lower surface of the motor attachment portion 171 (FIG. 3) of the base member 17 toward the bottom wall 11*a* (FIG. 3) while the rotation shaft 231 thereof is separated upward from the bottom wall 11*a* of the chamber 11. Further, the lower end part of the substrate holder 2A is held by the base member 17, being hung from the lower surface of the spin chuck attachment portion 172 (FIG. 3) of the base member 17 toward the bottom wall 11*a* while being separated upward from the bottom wall 11*a* (FIG. 3). Moreover, the power transmitter 24 (=the first pulley 241+the second pulley 242+the endless belt 243) is arranged below the base member 17. By adopting such an arrangement, it becomes possible to efficiently perform the maintenance work without taking the interference with the other mechanisms into consideration. Further, it becomes possible to exchange the endless belt 243 by using a clearance formed between the lower end part of the substrate holder 2A and the rotation shaft 231 of the motor 23, and the bottom wall 11*a*. In other words, it is possible to exchange the endless belt 243 without detaching the first pulley 241 and the second pulley 242.

Figure 15:
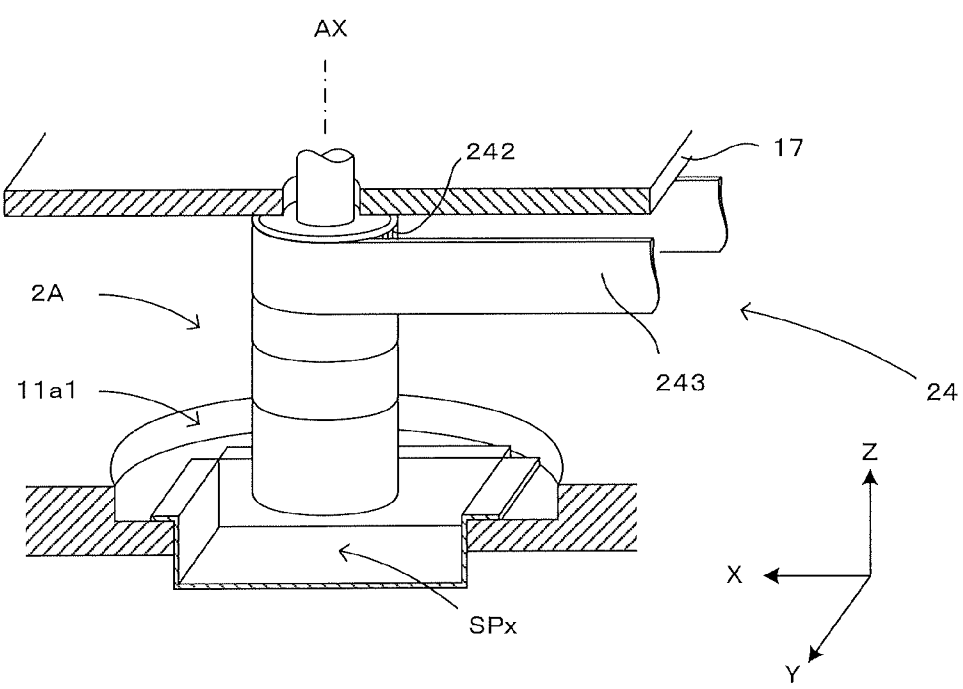
FIG. 15 is a diagram showing a configuration of a second embodiment of the substrate processing apparatus according to the invention.

(I) Further, the lower end part of the substrate holder 2A is sometimes extended vertically downward, for some reason, such as providing a port (not shown) for connecting the pipes 25 and 28 or the like to the central part of the substrate holder 2A, or the like. In this case, the clearance SPx formed between the lower end part of the substrate holder 2A and the bottom wall 11*a* is narrowed. Then, as shown in FIG. 15, for example, there may be a configuration where a counterbore 11*a*1 is provided in an area of the bottom wall 11*a* of the chamber 11, which faces the lower end part of the substrate holder 2A, to thereby expand the above-described clearance SPx.

(J) The base member 17 is disposed at the separation position away upward from the bottom wall 11*a* of the chamber 11, and a so-called raised floor structure is formed in the internal space 12 of the chamber 11. Then, the upper surface of the base member 17 is finished as a mounting surface on which the substrate processing part SP is to be installed. By such a layout of the raised floor structure, even if leakage of the processing liquid occurs and the processing liquid is pooled on the bottom wall 11*a* of the chamber 11, it is possible to reliably prevent the processing liquid from coming into contact with the substrate processing part SP. Therefore, there is no necessity of forming the base member 17 of a resin material, and by forming the base member 17 of a material having rigidity higher than that of the bottom wall 11*a*, the substrate processing part SP can be installed on the mounting surface, with the mounting surface of the base member 17 as a reference base. Therefore, the substrate processing part SP can be provided with maintainability better than that of the conventional apparatus having a configuration where the bottom wall is formed of a resin material in consideration of chemical resistance of the processor. Further, since the substrate processing part SP can be installed at a position higher than the bottom wall 11*a* in the vertical direction Z, there is no necessity of attaching an additional component such as a cover or the like used to prevent an ill effect of the processing liquid, to the substrate processing part SP. As a result, though the substrate processing part SP that processes the substrate W by using a chemical liquid as the processing liquid is disposed in the internal space 12 of the chamber 11, it is possible to perform substrate processing on a substrate with a low cost and excellent maintainability while avoiding an ill effect of leakage of the processing liquid.

Herein, a dish-like container, for example, may be disposed on the upper surface of the bottom wall 11*a* as a collecting member for collecting the processing liquid flowing toward the bottom wall 11*a*, i.e., a leakage liquid. It is thereby possible to reliably collect the processing liquid and exclude the processing liquid from the chamber 11. Further, the collected processing liquid may be reused as necessary, and it is thereby possible to suppress the consumption of the processing liquid and ensure reduction in the environmental load.

Further, the present invention is not limited to the above-described embodiments and numerous modifications and variations can be added to those described above without departing from the scope of the invention. In the above-described embodiment, for example, the present invention is applied to the substrate processing apparatus 1 having the rotating cup 31. Furthermore, in the above-described embodiment, the present invention is applied to the substrate processing apparatus 1 having the upper surface protecting/heating mechanism 4, the atmosphere separating mechanism 6, the centering mechanism 8, and the substrate observing mechanism 9. As described in, for example, Japanese Patent Application Laid Open Gazette No. 2022-52835, however, the present invention can be applied to a substrate processing apparatus not having these constituent components, i.e., a substrate processing apparatus which processes the peripheral edge part of the substrate W by supplying a processing liquid to the peripheral edge part of the substrate W in the internal space 12 of the chamber 11.

Further, though the present invention is applied to the substrate processing apparatus which performs the bevel processing as one example of "substrate processing", the present invention can be applied to a substrate processing apparatus in general which performs substrate processing on a substrate by supplying a processing liquid onto the substrate while being rotated.

Although the invention has been described by way of the specific embodiments above, this description is not intended to be interpreted in a limited sense. By referring to the description of the invention, various modifications of the disclosed embodiments will become apparent to a person skilled in this art similarly to other embodiments of the invention. Hence, appended claims are thought to include these modifications and embodiments without departing from the true scope of the invention.

This invention is applicable to a substrate processing apparatus in general for performing substrate processing by supplying a processing liquid to a substrate in an internal space of a chamber.

What is claimed is:

1. A substrate processing apparatus, comprising:

a chamber configured to surround an internal space by a bottom wall, a sidewall standing from a periphery of the bottom wall, and a ceiling wall covering an upper end part of the sidewall;

a substrate processing part configured to perform predetermined substrate processing on a substrate by supplying a chemical liquid as a processing liquid onto the substrate while rotating the substrate in a horizontal posture about an axis of rotation extending in a vertical direction;

a plurality of base support members standing vertically upward from the bottom wall;

a base member having rigidity higher than that of the bottom wall supported by upper end parts of the plurality of base support members, the base member having a mounting surface having the substrate processing part mounted thereon, and the base member being supported by the upper end parts of the plurality of base support members spaced from the bottom wall and oriented to have the mounting surface thereof facing away from the bottom wall;

a cup configured to collect liquid droplets of the processing liquid scattered from the substrate; and an elevating mechanism having an elevation motor attached to an upper surface of the base member, the elevation motor configured to move a part of the cup up and down in a vertical direction by a rotational driving force generated by the elevation motor.

2. The substrate processing apparatus according to claim 1, wherein the base member is a metal plate.

3. The substrate processing apparatus according to claim 2, wherein the substrate processing part has:

a substrate holder attached to the base member with a lower end part thereof spaced from the bottom wall, the substrate holder being rotatable about an axis of rotation extending in a vertical direction while holding the substrate in a substantially horizontal orientation at an upper end part thereof;

a rotating mechanism having a motor and a power transmitter configured to transmit a rotational driving force generated by the motor to the lower end part of the substrate holder so as to rotate the substrate holder about the axis of rotation by the rotational driving force, the motor attached to the base member in a position spaced upward from the bottom wall; and a nozzle configured to supply the processing liquid onto the substrate rotated about the axis of rotation while being held by an upper end part of the substrate holder.

4. The substrate processing apparatus according to claim 1, wherein the bottom wall is formed of a resin material having a chemical resistance to the processing liquid.

5. The substrate processing apparatus according to claim 1, further comprising:

a collecting member disposed between the bottom wall and the base member in a vertical direction and configured to collect the processing liquid flowing down toward the bottom wall.

6. The substrate processing apparatus according to claim 1, wherein the cup has a lower cup and an upper cup being engageable with and disengageable from the lower cup, and the elevation motor is configured to vertically move the upper cup between a raised position where the upper cup is separated from the lower cup and a lowered position where the upper cup is coupled to the lower cup.

7. A substrate processing apparatus, comprising:

a chamber configured to surround an internal space by a bottom wall, a sidewall standing from a periphery of the bottom wall, and a ceiling wall covering an upper end part of the sidewall;

a substrate processing part configured to perform predetermined substrate processing on a substrate by supplying a chemical liquid as a processing liquid onto the substrate while rotating the substrate in a horizontal posture about an axis of rotation extending in a vertical direction;

a plurality of base support members standing vertically upward from the bottom wall;

a base member having rigidity higher than that of the bottom wall supported by upper end parts of the plurality of base support members, the base member having a mounting surface having the substrate processing part mounted thereon, and the base member being supported by the upper end parts of the plurality of base support members spaced from the bottom wall and oriented to have the mounting surface thereof facing away from the bottom wall;

wherein the base member is a metal plate, the substrate processing part has:

a substrate holder attached to the base member with a lower end part thereof spaced from the bottom wall, the substrate holder being rotatable about an axis of rotation extending in a vertical direction while holding the substrate in a substantially horizontal orientation at an upper end part thereof;

a rotating mechanism having a motor and a power transmitter configured to transmit a rotational driving force generated by the motor to the lower end part of the substrate holder so as to rotate the substrate holder about the axis of rotation by the rotational driving force, the motor attached to the base member in a position spaced upward from the bottom wall; and a nozzle configured to supply the processing liquid onto the substrate rotated about the axis of rotation while being held by an upper end part of the substrate holder; and wherein the base member has a first holding portion and a second holding portion, the first holding portion holding the motor while being hung from a lower surface of the base member with a rotation shaft of the motor facing toward the bottom wall, the second holding portion holding the substrate holder while being hung from the lower surface of the base member with a lower end part of the substrate holder facing toward the bottom wall, and the power transmitter has a first pulley attached to a lower end part of the rotation shaft, a second pulley attached to the lower end part of the substrate holder, and an endless belt put over between the first pulley and the second pulley below the base member.

* * * * *